(12) United States Patent
Cha et al.

(10) Patent No.: US 11,949,055 B2
(45) Date of Patent: Apr. 2, 2024

(54) UNIT PIXEL HAVING LIGHT EMITTING DEVICE AND DISPLAYING APPARATUS

(71) Applicant: SEOUL VIOSYS CO., LTD., Gyeonggi-do (KR)

(72) Inventors: Namgoo Cha, Gyeonggi-do (KR); Sang Min Kim, Gyeonggi-do (KR); Seongchan Park, Gyeonggi-do (KR); Yeonkyu Park, Gyeonggi-do (KR); Jae Hee Lim, Gyeonggi-do (KR); Jinkyu Jang, Gyeonggi-do (KR)

(73) Assignee: SEOUL VIOSYS CO., LTD., Ansan-si (KR)

( * ) Notice: Subject to any disclaimer, the term of this patent is extended or adjusted under 35 U.S.C. 154(b) by 241 days.

(21) Appl. No.: 17/322,129

(22) Filed: May 17, 2021

(65) Prior Publication Data

US 2021/0367124 A1    Nov. 25, 2021

Related U.S. Application Data

(60) Provisional application No. 63/071,522, filed on Aug. 28, 2020, provisional application No. 63/028,784, filed on May 22, 2020.

(51) Int. Cl.
| | |
|---|---|
| *H01L 33/62* | (2010.01) |
| *H01L 25/075* | (2006.01) |
| *H01L 25/16* | (2023.01) |
| *H01L 33/22* | (2010.01) |
| *H01L 33/46* | (2010.01) |

(Continued)

(52) U.S. Cl.
CPC .......... *H01L 33/62* (2013.01); *H01L 25/0753* (2013.01); *H01L 25/167* (2013.01); *H01L 33/22* (2013.01); *H01L 33/46* (2013.01); *H01L 33/54* (2013.01); *H01L 33/58* (2013.01)

(58) Field of Classification Search
CPC ......... H01L 33/62; H01L 33/22; H01L 33/46; H01L 33/58; H01L 25/0753; H01L 25/167

See application file for complete search history.

(56) References Cited

U.S. PATENT DOCUMENTS

2007/0296325 A1* 12/2007 Sasaki .................. H01J 1/63
                                                                 313/483
2013/0193464 A1*  8/2013 Bae .................... H01L 33/405
                                                                 257/94

(Continued)

FOREIGN PATENT DOCUMENTS

| KR | 1020170099324 A | 8/2017 |
|---|---|---|
| KR | 1020180003063 A | 1/2018 |

(Continued)

OTHER PUBLICATIONS

International Search Report for International Application No. PCT/KR2021/006290, dated Sep. 2, 2021, 2 pages.

*Primary Examiner* — Feifei Yeung Lopez
(74) *Attorney, Agent, or Firm* — Perkins Coie LLP

(57) ABSTRACT

A unit pixel includes a transparent substrate, a plurality of light emitting devices arranged on the transparent substrate, connection layers electrically connected to the light emitting devices, and bonding pads disposed over the connection layers and electrically connected to the connection layers. The bonding pads are partially overlapped with at least one of the light emitting devices in a vertical direction, respectively.

19 Claims, 19 Drawing Sheets

(51) Int. Cl.
*H01L 33/54* (2010.01)
*H01L 33/58* (2010.01)

(56) References Cited

U.S. PATENT DOCUMENTS

| | | | | |
|---|---|---|---|---|
| 2014/0042489 | A1* | 2/2014 | Preuschl | F21V 23/005 438/26 |
| 2016/0293811 | A1* | 10/2016 | Hussell | H01L 27/156 |
| 2017/0294479 | A1* | 10/2017 | Cha | H01L 27/156 |
| 2019/0229097 | A1* | 7/2019 | Takeya | H01L 25/167 |
| 2020/0227395 | A1* | 7/2020 | Shi | H01L 25/0753 |

FOREIGN PATENT DOCUMENTS

| | | |
|---|---|---|
| KR | 1020190026617 A | 3/2019 |
| KR | 1020190098709 A | 8/2019 |

* cited by examiner

UNIT PIXEL HAVING LIGHT EMITTING DEVICE AND DISPLAYING APPARATUS

CROSS-REFERENCE OF RELATED APPLICATIONS AND PRIORITY

The Present Applications is a Non-provisional Application which claims priority to and the benefit of the filing dates of U.S. Provisional application Nos. 63/028,784 filed May 22, 2020 and 63/071,522 filed Aug. 28, 2020, the disclosure of which are incorporated by reference in their entirety.

TECHNICAL FIELD

Exemplary embodiments relate to a unit pixel having a light emitting device and a displaying apparatus having the same.

BACKGROUND

Light emitting devices are semiconductor devices using light emitting diodes which are inorganic light sources, and are used in various technical fields such as displaying apparatuses, automobile lamps, general lighting, and the like. Light emitting diodes have advantages such as longer lifespan, lower power consumption, and fast response, than existing light sources, and thus, the light emitting diodes have been replacing the existing light sources.

Conventional light emitting diodes have been generally used as backlight light sources in displaying apparatuses. Displaying apparatuses that directly realize images using the light emitting diodes have been recently developed by using micro LED displays.

In general, a displaying apparatus displays various colors through mixture of blue, green, and red light. In order to realize various images, the displaying apparatus includes a plurality of pixels, each including sub-pixels corresponding to one of blue, green, and red light. As such, a color of a certain pixel is typically determined based on the colors of the sub-pixels, so that images can be realized through the combination of such pixels.

In the case of the micro LED display, a micro LED is arranged on a two-dimensional plane corresponding to each sub pixel, and, accordingly, a large number of micro LEDs is arranged on a single substrate. However, the micro LED is small, for example, 200 μm or less, and more particularly, 100 μm or less, and these small sizes cause various drawbacks In particular, it is difficult to handle the light emitting diodes having small sizes, and thus, it is not easy to directly mount the light emitting diodes on a display panel.

FIG. 13A is a schematic diagram illustrating a irregularity that occurs when light emitting diodes are mounted on a display panel, and FIG. 13B is an image showing the irregularity illustrated in FIG. 13A.

A unit pixel 500 may undergo a number of transfer processes until it is disposed on a panel substrate, and in this case, pressure may be applied to the protection layer 531 by an ejector pin 150. When the ejector pin 150 presses the protection layer 531 formed of a relatively thick a photosensitive solder resist (PSR), pressing marks may remain on the protection layer 531, which may lead to a failure in an appearance inspection, and further, a irregularity 151 or the like may occur. As shown in FIG. 13B, the irregularity 151, in particular, a crack, may occur in the protection layer 531 due to the ejector pin 150.

Furthermore, since the protection layer 531 formed of PSR is relatively thick, it may cause a large stress on the unit pixel 500, and accordingly, cracks in micro LED devices or various thin layers may occur or these thin layers may be peeled off.

SUMMARY

Exemplary embodiments provide a unit pixel that is suitable for being mounted on a circuit board and a displaying apparatus having the same.

Exemplary embodiments provide a unit pixel that has high reliability and a displaying apparatus having the same.

Exemplary embodiments provide a unit pixel that is capable of increasing a contact area of a bump pad in a small unit pixel and a displaying apparatus having the same.

Exemplary embodiments provide a unit pixel that is capable of solving the drawback caused by forming a protection layer using PSR.

Exemplary embodiments provide a unit pixel, the unit pixel including a transparent substrate, a plurality of light emitting devices arranged on the transparent substrate, connection layers electrically connected to the light emitting devices, and bonding pads disposed over the connection layers, and electrically connected to the connection layers. The bonding pads are partially overlapped with at least one of the light emitting devices in a vertical direction, respectively.

Exemplary embodiments provide a displaying apparatus including a circuit board having pads, a plurality of unit pixels disposed on the circuit board, and bonding materials bonding the unit pixels to the pads. Each of the unit pixels includes a transparent substrate, a plurality of light emitting devices arranged on the transparent substrate, connection layers electrically connected to the light emitting devices, and bonding pads disposed over the connection layers and electrically connected to the connection layers. The bonding pads are partially overlapped with at least one of the light emitting devices in a vertical direction, respectively, and the bonding materials bond the bonding pads and the pads on the circuit board.

DESCRIPTION OF DRAWINGS

FIG. 9A illustrates forming a concave-convex pattern on a surface of a transparent substrate;

FIG. 9B illustrates forming a light blocking layer on the surface layer;

FIG. 9C illustrates a light emitting device disposed on an adhesive layer;

FIG. 9D illustrates forming a step adjustment layer to cover light emitting devices;

FIG. 9E illustrates forming first, second, third, and fourth connection layers on the step adjustment layer; and FIG. 9F illustrates forming an insulation material layer.

DETAILED DESCRIPTION OF EMBODIMENTS

Figure 1:
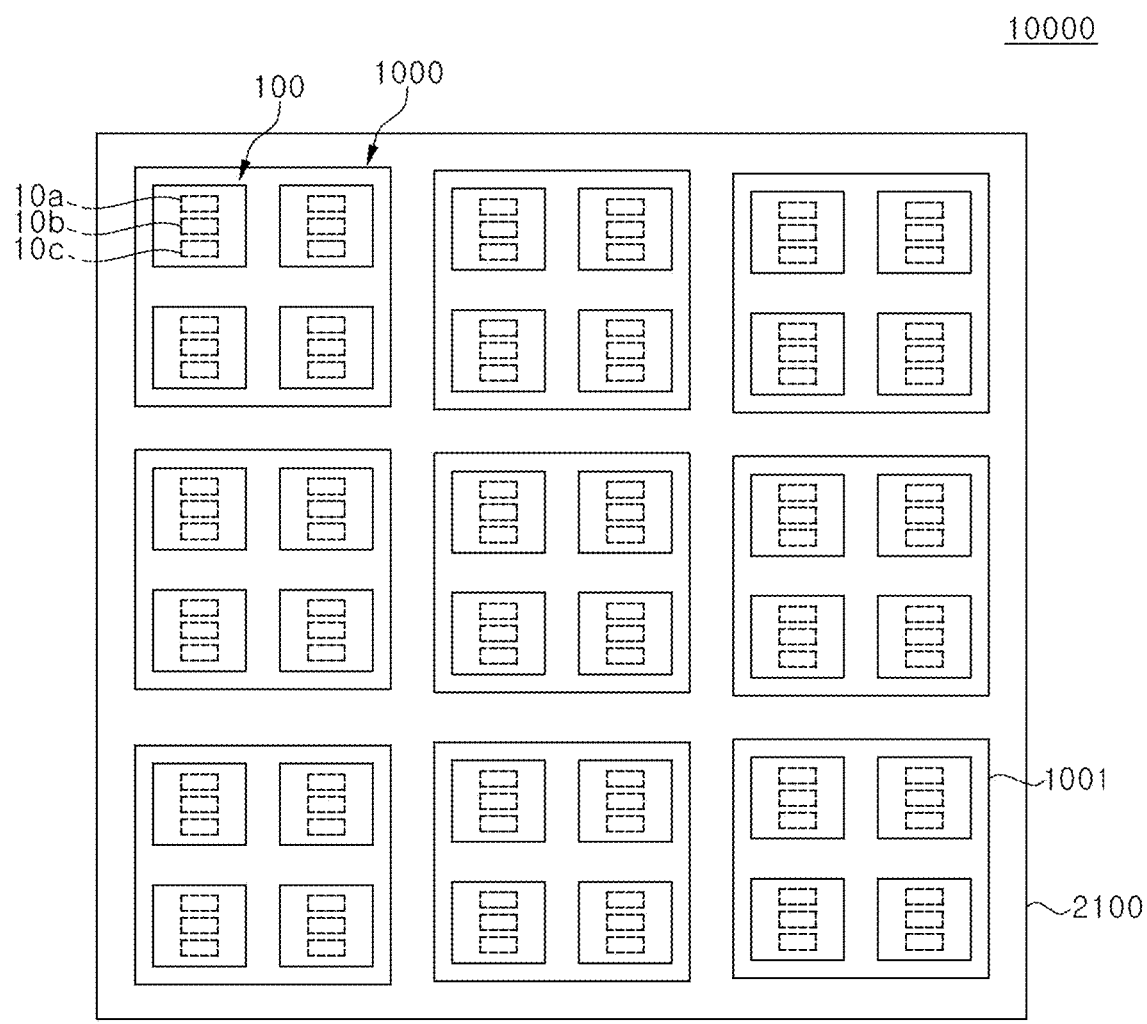
FIG. 1 is a schematic plan view illustrating a displaying apparatus according to an exemplary embodiment.

Hereinafter, embodiments will be described in detail with reference to the accompanying drawings. The following embodiments are provided by way of example so as to fully convey the spirit of the present disclosure to those skilled in the art to which the present disclosure pertains. Accordingly, the present disclosure is not limited to the embodiments disclosed herein and can also be implemented in different forms. In the drawings, widths, lengths, thicknesses, and the like of elements can be exaggerated for clarity and descriptive purposes. When an element or layer is referred to as being "disposed above" or "disposed on" another element or layer, it can be directly "disposed above" or "disposed on" the other element or layer or intervening elements or layers can be present. Throughout the specification, like reference numerals denote like elements having the same or similar functions.

A unit pixel according to an exemplary embodiment includes a transparent substrate, a plurality of light emitting devices arranged on the transparent substrate, connection layers electrically connected to the light emitting devices, and bonding pads disposed over the connection layers and electrically connected to the connection layers. The bonding pads are partially overlapped with at least one of the light emitting devices in a vertical direction, respectively.

As the bonding pads are disposed so as to be overlapped with the light emitting devices, areas of the bonding pads may be increased and thus, the unit pixel may be stably mounted on a circuit board using a reflow process or the like.

In one variant, at least one of the bonding pads may be partially overlapped with two of the light emitting devices in the vertical direction.

In another variant, the transparent substrate may have a concave-convex pattern on a surface facing the light emitting devices. A viewing angle of light emitted from the light emitting devices may be set to be uniform by the concave-convex pattern.

In further another variant, each of the plurality of light emitting devices may have a first concave-convex pattern on the surface facing the transparent substrate and a second concave-convex pattern formed on the first concave-convex pattern. Light extraction efficiency may be improved by the first and second concave-convex patterns, and the viewing angle of the light emitting devices may be set to be uniform.

In further another variant, the plurality of light emitting devices may include at least three light emitting devices emitting light of different colors, and the at least three light emitting devices may be arranged in a line.

In further another variant, the unit pixel may further include a light blocking layer disposed between the transparent substrate and the light emitting devices, and an adhesive layer disposed between the light blocking layer and the light emitting devices. The light blocking layer may have windows through which light generated from the light emitting devices passes, and the light emitting devices may be disposed corresponding to the windows.

In further another variant, the unit pixel may further include a surface layer disposed between the transparent substrate and the light blocking layer.

The surface layer prevents the light blocking layer from being peeled off from the transparent substrate by improving adhesion of the light blocking layer.

In another variant, the unit pixel may further include a step adjustment layer covering the light emitting devices, in which the step adjustment layer may have openings exposing the light emitting devices. The connection layers may be disposed on the step adjustment layer, and the connection layers may be electrically connected to the light emitting devices through the openings of the step adjustment layer.

In further another variant, the unit pixel may further include an insulation material layer covering the connection layers, in which the insulation material layer may have openings exposing the connection layers, and the bonding pads may be electrically connected to the connection layers through the openings of the insulation material layer.

The insulation material layer may cover side surfaces of the step adjustment layer along with side surfaces of the connection layers.

In an exemplary embodiment, the insulation material layer may have a thickness smaller than that of the step adjustment layer.

In an exemplary embodiment, the step adjustment layer and the insulation material layer may be formed of polyimide.

Each of the light emitting devices may include: a light emitting structure including a first conductivity type semiconductor layer, a second conductivity type semiconductor layer, and an active layer interposed between the first and second conductivity type semiconductor layers; and a first electrode pad and a second electrode pad disposed on the light emitting structure, in which the openings of the step adjustment layer may expose the first and second electrode pads.

Each of the light emitting devices may further include an insulation layer disposed between the light emitting structure and the first and second electrode pads, in which the insulation layer may include a distributed Bragg reflector.

The light emitting devices may include a red light emitting device, a green light emitting device, and a blue light emitting device, in which an insulation layer of the blue light emitting device may have a lower reflectance than those of insulation layers of the red and green light emitting devices. Since the reflectance of the insulation layer of the blue light emitting device is set to be lowered, a color mixing ratio of red light, green light, and blue light may be easily adjusted.

In an exemplary embodiment, the transparent substrate may have an area of 300 µm×300 µm or less, and further, 200 µm×200 µm or less.

A displaying apparatus according to an exemplary embodiment includes: a circuit board having pads; a plurality of unit pixels disposed on the circuit board; and bonding materials bonding the unit pixels to the pads, in which each of the unit pixels includes: a transparent substrate; a plurality of light emitting devices arranged on the transparent substrate; connection layers electrically connected to the light emitting devices; and bonding pads disposed over the connection layers, and electrically connected to the connection layers, in which the bonding pads are partially overlapped with at least one of the light emitting devices in a vertical direction, respectively, and the bonding materials bond the bonding pads and the pads on the circuit board.

The bonding materials may be solder.

The unit pixel may further include: a light blocking layer disposed between the transparent substrate and the light emitting devices; and an adhesive layer disposed between the light blocking layer and the light emitting devices, in which the light blocking layer may have windows through which light generated from the light emitting devices passes, and the light emitting devices may be disposed corresponding to the windows.

The transparent substrate may have an area of 300 µm×300 µm or less, and more particularly, 200 µm×200 µm or less.

Hereinafter, exemplary embodiments will be described in detail with reference to the accompanying drawings.

FIG. 1 is a schematic plan view illustrating a displaying apparatus according to an exemplary embodiment.

Referring to FIG. 1, a displaying apparatus 10000 includes a panel substrate 2100 and a plurality of pixel modules 1000.

The displaying apparatus 10000 is not particularly limited, but it may include a VR displaying apparatus such as a micro LED TV, a smart watch, a VR headset, or an AR displaying apparatus such as augmented reality glasses.

The panel substrate 2100 may include a circuit such as a passive matrix driving circuit or an active matrix driving circuit. In some forms, the panel substrate 2100 may include wirings and resistors therein, and, in other forms, the panel substrate 2100 may include wirings, transistors, and capacitors. The panel substrate 2100 may also have pads that are capable of being electrically connected to the disposed circuit on an upper surface thereof.

In some forms, a plurality of pixel modules 1000 is arranged on the panel substrate 2100. Each of the pixel modules 1000 may include a circuit board 1001 and a plurality of unit pixels 100 disposed on the circuit board 1001. In another form, the plurality of unit pixels 100 may be directly arranged on the panel substrate 2100.

Each of the unit pixels 100 also includes a plurality of light emitting devices 10a, 10b, and 10c. The light emitting devices 10a, 10b, and 10c may emit light of different colors from one another. The light emitting devices 10a, 10b, and 10c in each of the unit pixels 100 may be arranged in a line as shown in FIG. 1. In one form, the light emitting devices 10a, 10b, and 10c may be arranged in a vertical direction with respect to a display screen on which the image is displayed. However, the inventive concepts are not limited thereto, and the light emitting devices 10a, 10b, and 10c may be arranged in a lateral direction with respect to the display screen on which the image is displayed.

Hereinafter, each element of the displaying apparatus 10000 will be described in detail in the order of the light emitting device 10a, 10b, and 10c, the unit pixel 100, and the pixel module 1000 that are disposed in the displaying apparatus 10000.

Figure 2A:
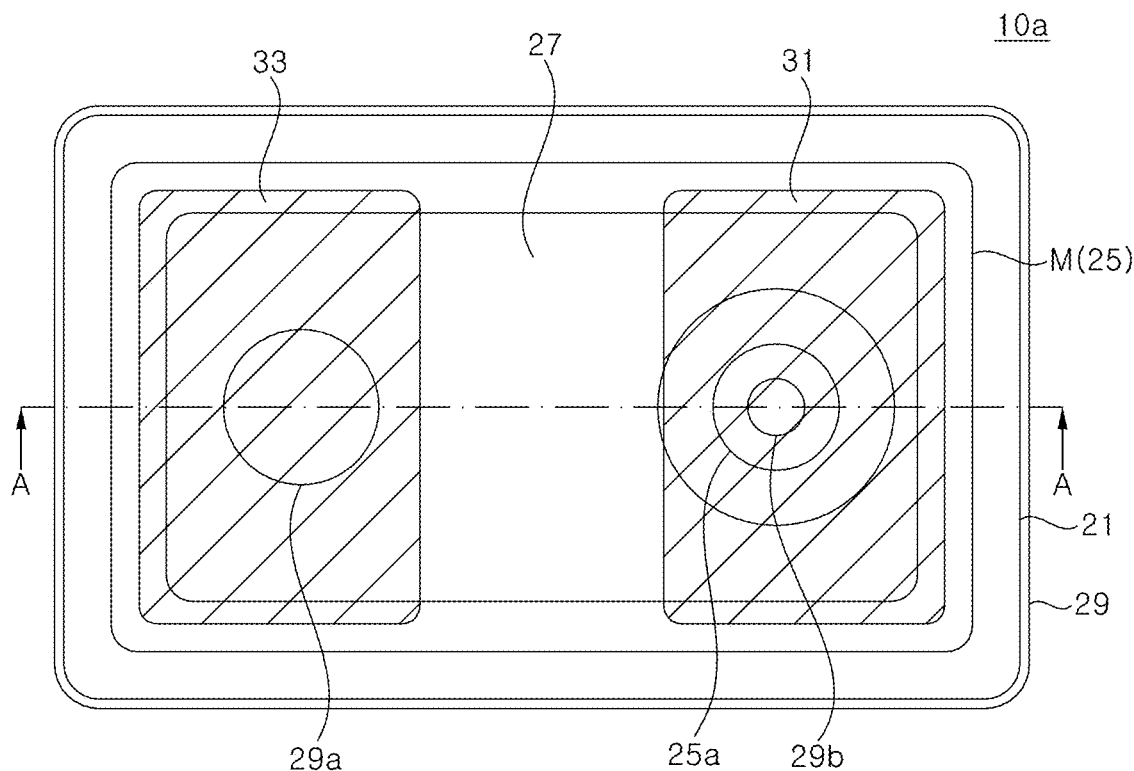
FIG. 2A is a schematic plan view illustrating a light emitting device according to an exemplary embodiment.
Figure 2B:
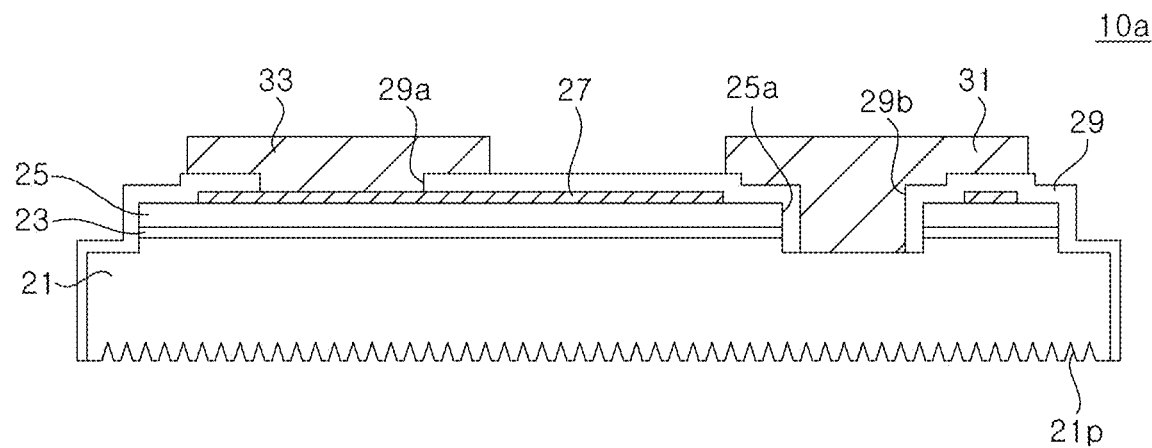
FIG. 2B is a schematic cross-sectional view taken along line A-A of FIG. 2A.

FIG. 2A is a schematic plan view illustrating the light emitting device 10a according to an exemplary embodiment, and FIG. 2B is a schematic cross-sectional view taken along line A-A of FIG. 2A. Herein, the light emitting device 10a is exemplarily described, but since the light emitting devices 10b and 10c have a substantially similar structure to that of the light emitting device 10a, repeated descriptions thereof will be omitted.

Referring to FIG. 2A and FIG. 2B, the light emitting device 10a includes a light emitting structure including a first conductivity type semiconductor layer 21, an active layer 23, and a second conductivity type semiconductor layer 25. In addition, the light emitting device 10a may include an ohmic contact layer 27, an insulation layer 29, a first electrode pad 31, and a second electrode pad 33.

The light emitting structure, that is, the first conductivity type semiconductor layer 21, the active layer 23, and the second conductivity type semiconductor layer 25 may be grown on a substrate. The substrate may be one of various substrates that are used to grow semiconductors, such as a gallium nitride substrate, a GaAs substrate, a Si substrate, a sapphire substrate, especially a patterned sapphire substrate. The growth substrate may be separated from the semiconductor layers using a process such as a mechanical grinding, a laser lift off, a chemical lift off process, or the like. However, the inventive concepts are not limited thereto, and, in some exemplary embodiments, a portion of the substrate may remain to constitute at least a portion of the first conductivity type semiconductor layer 21.

In some forms, the light emitting device 10a emits red light according to an exemplary embodiment, and the semiconductor layers may include aluminum gallium arsenide (AlGaAs), gallium arsenide phosphide (GaAsP), aluminum gallium indium phosphide (AlGaInP), or gallium phosphide (GaP).

In another form, the light emitting device 10b emits green light, and the semiconductor layers may include indium gallium nitride (InGaN), gallium nitride (GaN), gallium phosphide (GaP), aluminum gallium indium phosphide (AlGaInP), or aluminum gallium phosphide (AlGaP).

In further another form, the light emitting device 10c emits blue light according to an exemplary embodiment, and the semiconductor layers may include gallium nitride (GaN), indium gallium nitride (InGaN), or zinc selenide (ZnSe).

The first conductivity type and the second conductivity type have opposite polarities, such as, when the first conductivity type is an n-type, the second conductivity type becomes a p-type, and, when the first conductivity type is a p-type, the second conductivity type becomes an n-type.

The first conductivity type semiconductor layer 21, the active layer 23, and the second conductivity type semiconductor layer 25 may be grown on the substrate in a chamber using a known process such as metal organic chemical vapor deposition (MOCVD) process. In addition, the first conductivity type semiconductor layer 21 includes n-type impurities (e.g., Si, Ge, and Sn), and the second conductivity type semiconductor layer 25 includes p-type impurities (e.g., Mg, Sr, and Ba). In an exemplary embodiment, the first conductivity type semiconductor layer 21 may include GaN or AlGaN containing Si as a dopant, and the second conductivity type semiconductor layer 25 may include GaN or AlGaN containing Mg as a dopant.

Although the first conductivity type semiconductor layer 21 and the second conductivity type semiconductor layer 25 are shown as single layers in FIGS. 2A and 2B, these layers may be multiple layers, and may also include a superlattice layer. The active layer 23 may include a single quantum well structure or a multiple quantum well structure, and a composition ratio of a nitride-based semiconductor may be adjusted to emit a desired wavelength. For example, the active layer 23 may emit blue light, green light, red light, or ultraviolet light.

The second conductivity type semiconductor layer 25 and the active layer 23 may have a mesa M structure and may be disposed on the first conductivity type semiconductor layer 21. The mesa M may include the second conductivity type semiconductor layer 25 and the active layer 23, and may include a portion of the first conductivity type semiconductor layer 21 as shown in FIG. 2B. The mesa M may be disposed on the portion of the first conductivity type semiconductor layer 21, and an upper surface of the first conductivity type semiconductor layer 21 may be exposed around the mesa M.

The first conductivity type semiconductor layer 21 may have a concave-convex pattern 21p by surface texturing. Surface texturing may be carried out by patterning, for example, using a dry or wet etching process. For example, cone-shaped protrusions may be formed, a height of the cone may be about 2 µm to 3 µm, a distance between the cones may be about 1.5 µm to 2 µm, and a diameter of a bottom of the cone may be about 3 µm to 5 µm. The cone may also be truncated, in which case an upper diameter of the cone may be about 2 µm to 3 µm. Furthermore, fine irregularities may be additionally formed on the concave-convex pattern 21p. The fine irregularities may be formed using, for example, wet etching. Since the concave-convex pattern 21p is formed on the surface of the first conductivity type semiconductor layer 21, total internal reflection may be reduced, thereby increasing light extraction efficiency. Surface texturing may be carried out on the first conductivity type semiconductor layers in all of the first, second, and third light emitting devices 10a, 10b, and 10c, but the inventive concepts are not limited thereto, and, in some exemplary embodiments, surface texturing may not be carried out in some of the light emitting devices.

The mesa M may have a through hole 25a exposing the first conductivity type semiconductor layer 21. The through hole 25a may be disposed close to one edge of the mesa M, but the inventive concepts are not limited thereto, and, in some exemplary embodiments, the through hole 25a may be disposed at a center of the mesa M.

The ohmic contact layer 27 is disposed on the second conductivity type semiconductor layer 25 to be in ohmic contact with the second conductivity type semiconductor layer 25. The ohmic contact layer 27 may be formed of a single layer or multiple layers, and may be formed of a transparent conductive oxide film or a metal film. For example, the transparent conductive oxide film may include ITO, ZnO, or the like, and the metal film may include a metal such as Al, Ti, Cr, Ni, Au, or the like and alloys thereof.

The insulation layer 29 covers the mesa M and the ohmic contact layer 27. The insulation layer 29 may further cover upper and side surfaces of the first conductivity type semiconductor layer 21 exposed around the mesa M. The insulation layer 29 may have an opening 29a exposing the ohmic contact layer 27 and an opening 29b exposing the first conductivity type semiconductor layer 21 in the through hole 25a. The insulation layer 29 may be formed of a single layer or multiple layers of a silicon oxide layer or a silicon nitride film. The insulation layer 29 may also include an insulation reflector, such as a distributed Bragg reflector.

The first electrode pad 31 and the second electrode pad 33 are disposed on the insulation layer 29. The second electrode pad 33 may be electrically connected to the ohmic contact layer 27 through the opening 29a, and the first electrode pad 31 may be electrically connected to the first conductivity type semiconductor layer 21 through the opening 29b, as shown in FIGS. 2A and 2B.

The first and/or second electrode pads 31 and 33 may be formed of a single layer or multiple layers of metal. As a material of the first and/or second electrode pads 31 and 33, a metal such as Al, Ti, Cr, Ni, Au, or the like and an alloy thereof or the like may be used.

Although the light emitting device 10a has been briefly described with reference to the drawings, the light emitting device 10a may further include a layer having additional functions in addition to the above-described layers. For example, various layers such as a reflective layer for reflecting light, an additional insulation layer for insulating a specific element, and a solder preventing layer for preventing diffusion of solder may be further included.

When a flip chip type light emitting device is formed, the mesa may be formed to have various shapes, and the locations and shapes of the first and second electrode pads 31 and 33 may also be variously modified. In addition, the ohmic contact layer 27 may be omitted, and the second electrode pad 33 may directly contact the second conductivity type semiconductor layer 25. Although the first electrode pad 31 is shown as being directly connected to the first conductivity type semiconductor layer 21, the contact layer may be formed first on the first conductivity type semiconductor layer 21 exposed to the through hole 25a, and the first electrode pad 31 may be connected to the contact layer.

Figure 3A:
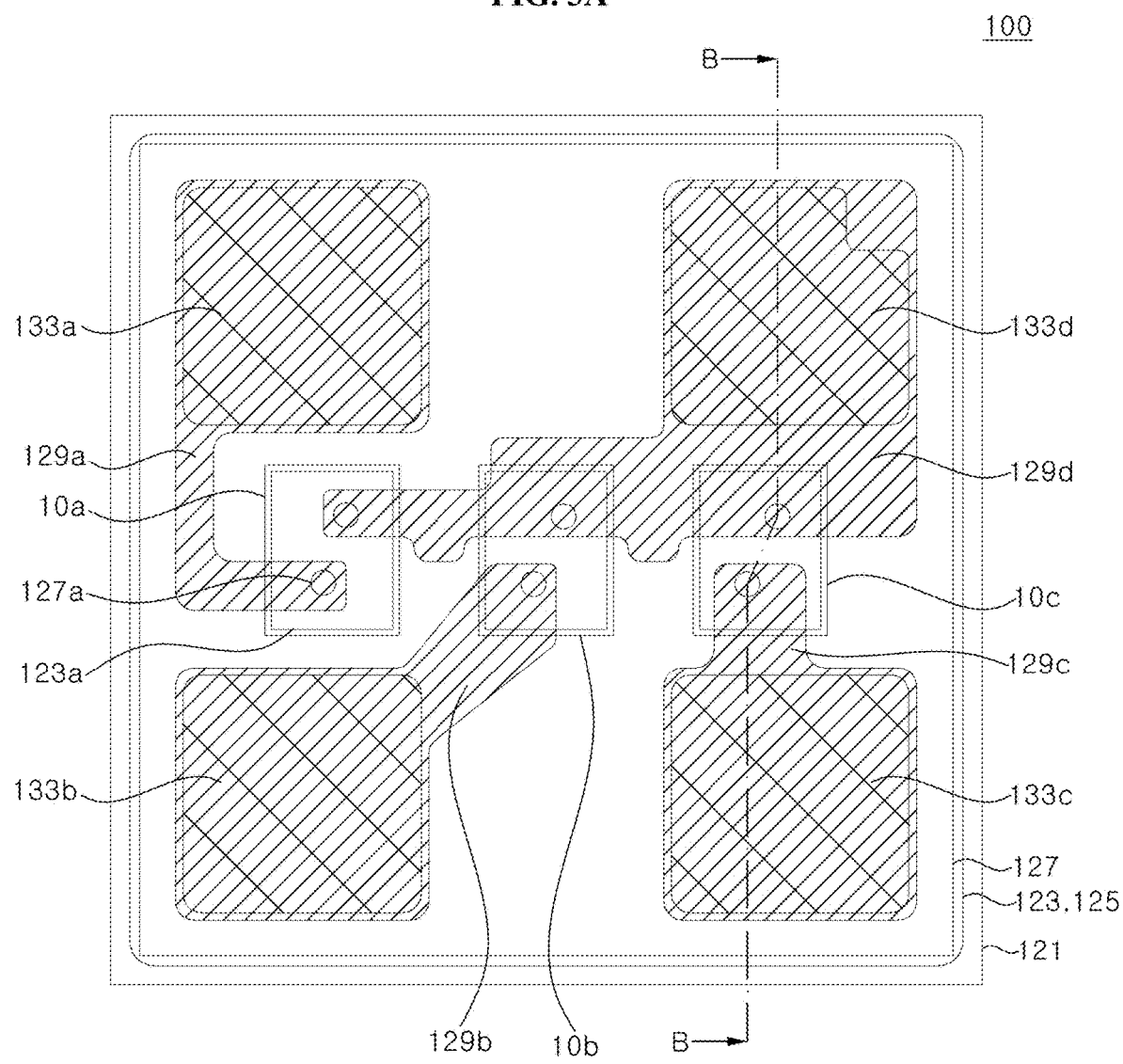
FIG. 3A is a schematic plan view illustrating a unit pixel according to a first exemplary embodiment.
Figure 3B:
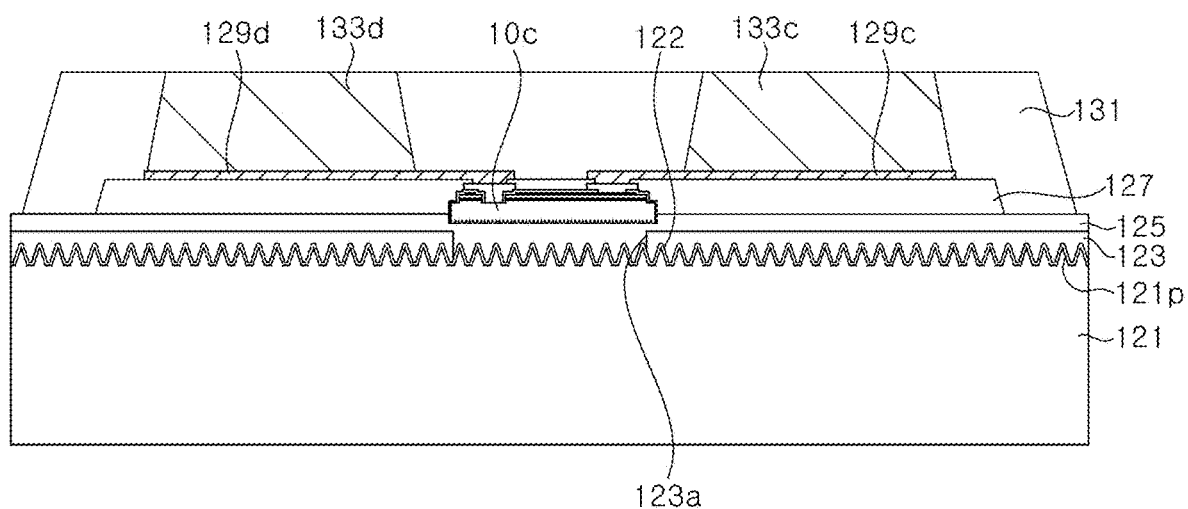
FIG. 3B is a schematic cross-sectional view taken along line B-B of FIG. 3A.

FIG. 3A is a schematic plan view illustrating a unit pixel 100 according to a first exemplary embodiment, and FIG. 3B is a schematic cross-sectional view taken along line B-B of FIG. 3A.

Referring to FIG. 3A and FIG. 3B, the unit pixel 100 may include a transparent substrate 121, a first, a second, and a third light emitting devices 10a, 10b, and 10c, a surface layer 122, a light blocking layer 123, and an adhesive layer 125, a step adjustment layer 127, connection layers 129a, 129b, 129c, and 129d, bumps 133a, 133b, 133c, and 133d, and a protection layer 131.

The unit pixel 100 provides a single pixel including the first, second, and third light emitting devices 10a, 10b, and 10c. The first, second, and third light emitting devices 10a, 10b, and 10c emit light of different colors from one another, and the first, second, and third light emitting devices 10a, 10b, and 10c correspond to subpixels, respectively.

The transparent substrate 121 is a light transmissive substrate such as PET, glass substrate, quartz, sapphire substrate, or the like. The transparent substrate 121 is disposed on a light exiting surface of the displaying apparatus 10000 of FIG. 1, and light emitted from the light emitting devices 10a, 10b, and 10c is emitted to the outside through the transparent substrate 121. The transparent substrate 121 may include a concave-convex pattern 121p on a surface facing the light emitting devices 10a, 10b, and 10c. The concave-convex pattern 121p scatters light emitted from the light emitting devices 10a, 10b, and 10c to increase a viewing angle. In addition, light emitted from the light emitting devices 10a, 10b, and 10c having different viewing angle characteristics from one another may be emitted at a uniform viewing angle by the concave-convex pattern 121p. As such, it is possible to prevent an occurrence of color difference depending on the viewing angle.

The concave-convex pattern 121p may be regular or irregular. The concave-convex pattern 121P may have, for example, a pitch of 3 μm, a diameter of 2.8 μm, and a height of 1.8 μm. The concave-convex pattern 121p may be a pattern generally applied to a patterned sapphire substrate, but the inventive concepts are not limited thereto.

The transparent substrate 121 may also include an anti-reflective coating, or may include an anti-glare layer or may be treated with an anti-glare treatment. The transparent substrate 121 may have a thickness of, for example, about 50 μm to 300 μm.

Since the transparent substrate 121 is disposed on the light exiting surface, the transparent substrate 121 does not include a circuit. However, the inventive concepts are not limited thereto, and, in some exemplary embodiments, the transparent substrate 121 may include the circuit.

Although a single unit pixel 100 is exemplarily illustrated to be formed on a single transparent substrate 121, a plurality of unit pixels 100 may be formed on the single transparent substrate 121.

The surface layer 122 covers the concave-convex pattern 121p of the transparent substrate 121. The surface layer 122 may be formed along a shape of the concave-convex pattern 121p. The surface layer 122 is formed to improve adhesion of the light blocking layer 123 formed thereon. For example, the surface layer 122 may be formed of a silicon oxide layer. In other forms, the surface layer 122 may be omitted depending on a type of the transparent substrate 121.

The light blocking layer 123 may include an absorbing material which absorbs light such as carbon black. The light absorbing material may prevent light generated in the light emitting devices 10a, 10b, and 10c from leaking from a region between the transparent substrate 121 and the light emitting devices 10a, 10b, and 10c toward a side surface thereof, and may improve contrast of the displaying apparatus.

The light blocking layer 123 may have a window 123a that is a route for light to progress, so that light generated in the light emitting devices 10a, 10b, and 10c is incident on the transparent substrate 121. A width of the window 123a may be smaller than that of the light emitting device, but the inventive concepts are not limited thereto, and, in some exemplary embodiments, may be greater than or equal to the width of the light emitting device.

The window 123a of the light blocking layer 123 also defines an arrangement location of the light emitting devices 10a, 10b, and 10c. As such, separate arrangement markers for defining arrangement locations of the light emitting devices 10a, 10b, and 10c may be omitted. However, the inventive concepts are not limited thereto, and, in some exemplary embodiments, the arrangement markers may be disposed on the transparent substrate 121, or on the light blocking layer 123 or the adhesive layer 125 to provide locations to arrange the light emitting devices 10a, 10b, and 10c.

The adhesive layer 125 is attached onto the transparent substrate 121. The adhesive layer 125 may cover the light blocking layer 123. The adhesive layer 125 may be attached to an entire surface of the transparent substrate 121, but the inventive concepts are not limited thereto, and, in some exemplary embodiments, the adhesive layer 125 may be attached to a portion of the transparent substrate 121 to expose a region near an edge of the transparent substrate 121. The adhesive layer 125 is used to attach the light emitting devices 10a, 10b, and 10c to the transparent substrate 121. The adhesive layer 125 may fill the window 123a formed in the light blocking layer 123.

The adhesive layer 125 may be formed of a light transmissive layer, and transmits light emitted from the light emitting devices 10a, 10b, and 10c. The adhesive layer 125 may be formed using an organic adhesive. For example, the adhesive layer 125 may be formed using a transparent epoxy. In addition, the adhesive layer 125 may include a diffuser such as $SiO_2$, $TiO_2$, ZnO, or the like to diffuse light. The light diffusing material prevents the light emitting devices 10a, 10b, and 10c from being observed from the light exiting surface.

The first, second, and third light emitting devices 10a, 10b, and 10c are disposed on the transparent substrate 121. The first, second, and third light emitting devices 10a, 10b, and 10c may be attached to the transparent substrate 121 by the adhesive layer 125. The first, second, and third light emitting devices 10a, 10b, and 10c may be disposed to correspond to the windows 123a of the light blocking layer 123. When the light blocking layer 123 is omitted, the arrangement markers may be added to provide the arrangement locations of the light emitting devices 10a, 10b, and 10c.

The first, second, and third light emitting devices 10a, 10b, and 10c may be, for example, a red light emitting device, a green light emitting device, and a blue light emitting device. Since specific configurations of each of the first, second, and third light emitting devices 10a, 10b, and 10c are the same as those described with reference to FIG. 2A and FIG. 2B, detailed descriptions thereof will be omitted.

The first, second, and third light emitting devices 10a, 10b, and 10c may be arranged in a line, as shown in FIG. 3A. In particular, in a case that the transparent substrate 121 is a sapphire substrate, the sapphire substrate may include clean-cut surfaces (e.g., m-plane) and non clean-cut surfaces (e.g., a-plane) due to a location of a crystal plane along a cutting direction. For example, when the sapphire substrate is cut into a quadrangular shape, two cutting planes on both sides thereof (e.g., m-plane) may be cut cleanly along the crystal plane, and two remaining cutting planes (e.g., a-plane) disposed in a direction perpendicular to the cutting planes may not cut cleanly. In this case, the clean-cut surfaces of the sapphire substrate 121 may be flush with an arrangement direction of the light emitting devices 10a, 10b, and 10c. For example, in FIG. 3A, the clean-cut surfaces (e.g., m-plane) may be disposed up and down, and the two remaining cut surfaces (e.g., a-plane) may be disposed left and right.

The first, second, and third light emitting devices 10a, 10b, and 10c may be those described above with reference to FIG. 2A and FIG. 2B, but the inventive concepts are not limited thereto, and various light emitting devices having a lateral or flip chip structure may be used.

The step adjustment layer 127 covers the first, second, and third light emitting devices 10a, 10b, and 10c. The step adjustment layer 127 has openings 127a exposing the first and second electrode pads 31 and 33 of the light emitting devices 10a, 10b, and 10c. The step adjustment layer 127 assists to safely form the connection layers by uniformly adjusting elevations of surfaces on which the connection layers 129a, 129b, 129c, and 129d are formed. Furthermore, the step adjustment layer 127 may equalize elevations of locations where the bumps 133a, 133b, 133c, and 133d are formed. The step adjustment layer 127 may be formed of, for example, photosensitive polyimide.

The step adjustment layer 127 may be disposed in a region surrounded by an edge of the adhesive layer 125, but the inventive concepts are not limited thereto. For example, the step adjustment layer 127 may be formed to partially expose the edge of the adhesive layer 125.

The first, second, third, and fourth connection layers 129a, 129b, 129c, and 129d are formed on the step adjustment layer 127. The connection layers 129a, 129b, 129c, and 129d may be connected to the first and second electrode pads 31 and 33 of the first, second, and third light emitting devices 10a, 10b, and 10c through the openings 127a of the step adjustment layer 127.

In an exemplary embodiment, as shown in FIGS. 3A and 3B, the first connection layer 129a may be electrically connected to a second conductivity type semiconductor layer of the first light emitting device 10a, the second connection layer 129b may be electrically connected to a second conductivity of the second light emitting device 10b, the third connection layer 129c may be electrically connected to a second conductivity type semiconductor layer of the third light emitting device 10c, and the fourth connection layer 129d may be commonly electrically connected to first conductivity type semiconductor layers of the first, second, and third light emitting devices 10a, 10b, and 10c. In some forms, the first, second, third, and fourth connection layers 129a, 129b, 129c, and 129d may be formed together on the step adjustment layer 127, and may include, for example, Au.

The bumps 133a, 133b, 133c, and 133d are formed on the connection layers 129a, 129b, 129c, and 129d, respectively. For example, the first bump 133a may be electrically connected to the second conductivity type semiconductor layer of the first light emitting device 10a through the first connection layer 129a, the second bump 133b may be electrically connected to the second conductivity type semiconductor layer of the second light emitting device 10b through the second connection layer 129b, and the third bump 133c may be electrically connected to the second conductivity type semiconductor layer of the third light emitting device 10c through the third connection layer 129c. Meanwhile, the fourth bump 133d may be commonly electrically connected to the first conductivity type semiconductor layers of the first, second, and third light emitting devices 10a, 10b, and 10c through the fourth connection layer 129d. The bumps 133a, 133b, 133c, and 133d may be formed of, for example, a metal and/or a metal alloy such as AuSn, SnAg, Sn, CuSn, CuN, CuAg, Sb, Ni, Zn, Mo, Co, solder, or the like.

In another exemplary embodiment, the first connection layer 129a may be electrically connected to the first conductivity type semiconductor layer of the first light emitting device 10a, the second connection layer 129b may be electrically connected to the first conductivity type semiconductor layer of the second light emitting device 10b, the third connection layer 129c may be electrically connected to the first conductivity type semiconductor layer of the third light emitting device 10c, and the fourth connection layer 129d may be commonly electrically connected to the second conductivity type semiconductor layers of the first, second, and third light emitting devices 10a, 10b, and 10c. The first, second, third, and fourth connection layers 129a, 129b, 129c, and 129d may be formed together on the step adjustment layer 127.

Furthermore, the bumps 133a, 133b, 133c, and 133d are formed on the connection layers 129a, 129b, 129c, and 129d, respectively. For example, the first bump 133a may be electrically connected to the first conductivity type semiconductor layer of the first light emitting device 10a through the first connection layer 129a, the second bump 133b may be electrically connected to the first conductivity type semiconductor layer of the second light emitting device 10b through the second connection layer 129b, and the third bump 133c may be electrically connected to the first conductivity type semiconductor layer of the third light emitting device 10c through the third connection layer 129c. Meanwhile, the fourth bump 133d may be commonly electrically connected to the second conductivity type semiconductor layers of the first, second, and third light emitting devices 10a, 10b, and 10c through the fourth connection layer 129d.

The protection layer 131 may cover side surfaces of the bumps 133a, 133b, 133c, and 133d, and may cover the step adjustment layer 127. In addition, the protection layer 131 may cover the adhesive layer 125 exposed around the step adjustment layer 127. The protection layer 131 may be formed of, for example, a photosensitive solder resist (PSR), and, accordingly, the protection layer 131 may be patterned first through photolithography and development processes, and then the bumps 133a, 133b, 133c, and 133d may be formed. To this end, the protection layer 131 may be formed to have openings exposing the contact layers 129a, 129b, 129c, and 129d, and the bumps 133a, 133b, 133c, and 133d may be formed in the openings of the protection layer 131. The bumps 133a, 133b, 133c, and 133d may be omitted.

The protection layer 131 may be formed of a light absorbing material such as a white reflective material or a black epoxy to prevent light leakage.

In the illustrated exemplary embodiment, it is described by way of example that the light emitting devices 10a, 10b, and 10c are attached to the transparent substrate 121 by the adhesive layer 125, but the light emitting devices 10a, 10b, and 10c may be coupled to the transparent substrate 121 using a different coupler instead of the adhesive layer 125. For example, the light emitting devices 10a, 10b, and 10c may be coupled to the transparent substrate 121 using spacers, and thus, a region between the light emitting devices 10a, 10b, and 10c and the transparent substrate 121 may be filled with gas or liquid. An optical layer that transmits light emitted from the light emitting devices 10a, 10b, and 10c may be formed by these gases or liquids. The adhesive layer 125 described above is also an example of the optical layer. Herein, the optical layer is formed of a material different from that of the light emitting devices 10a, 10b, and 10c, for example, gas, liquid, or solid, and thus, is distinguished from the material of the semiconductor layers in the light emitting devices 10a, 10b, and 10c.

Figure 4A:
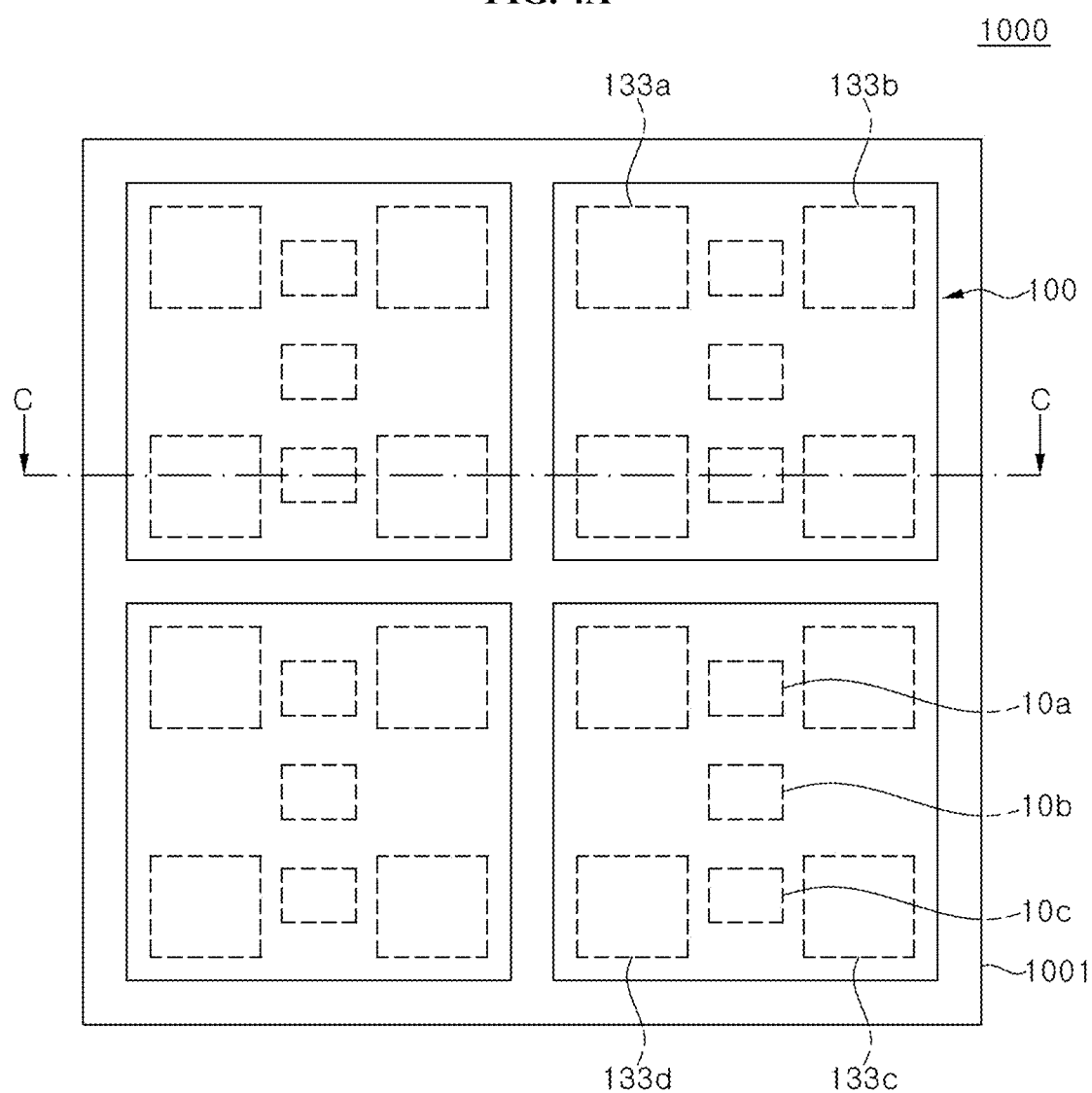
FIG. 4A is a schematic plan view illustrating a pixel module according to an exemplary embodiment.
Figure 4B:
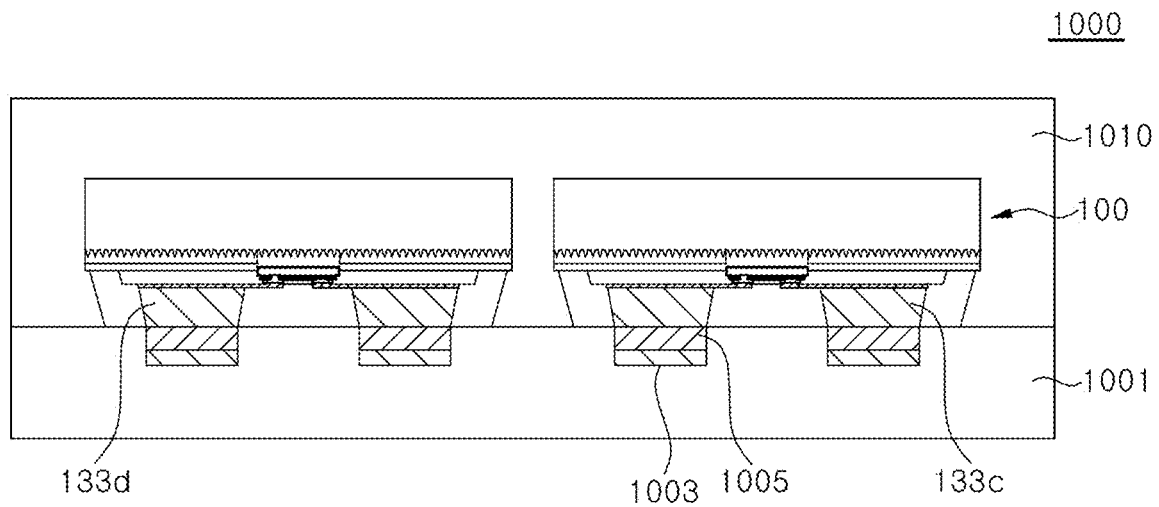
FIG. 4B is a schematic cross-sectional view taken along line C-C of FIG. 4A.
Figure 4C:
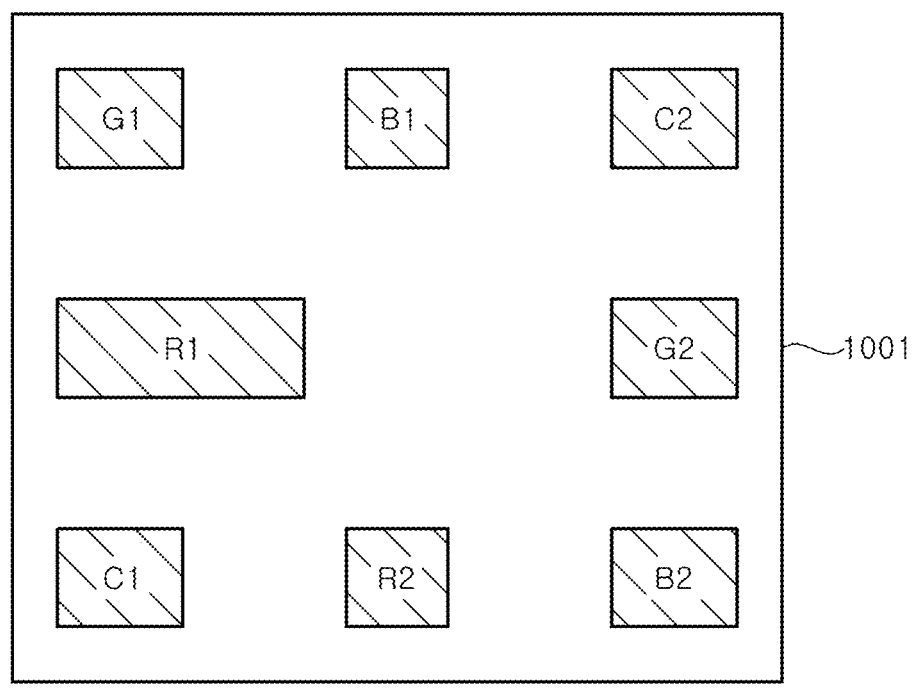
FIG. 4C is a schematic rear view illustrating a pixel module according to an exemplary embodiment.
Figure 4D:
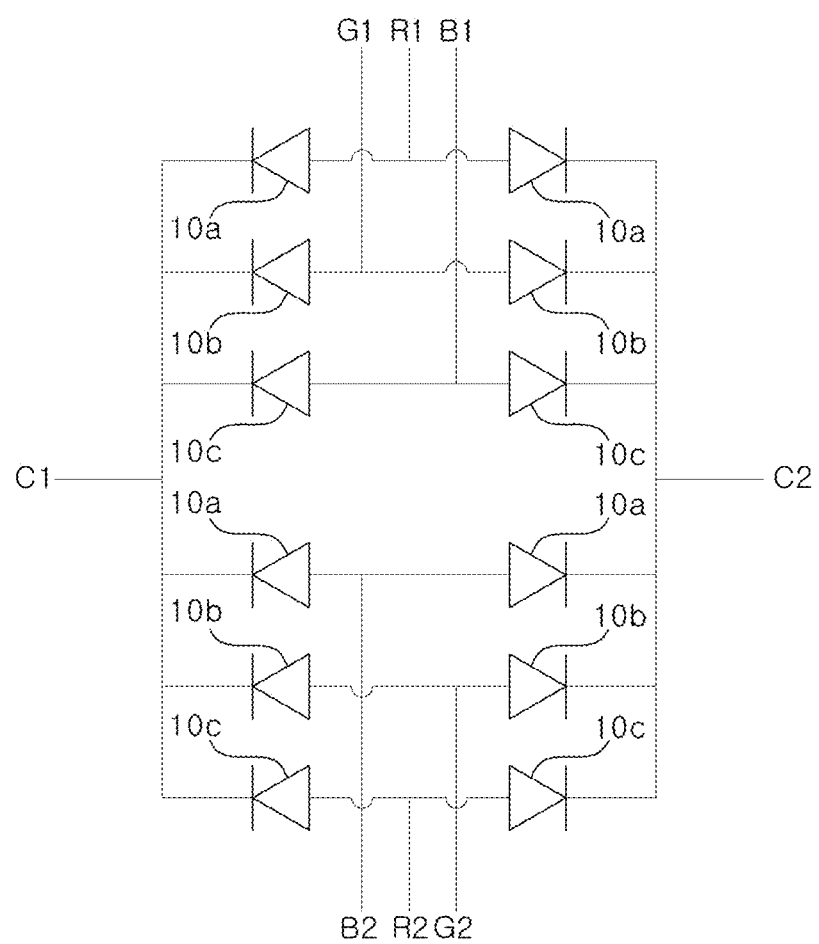
FIG. 4D is a schematic circuit diagram illustrating a pixel module according to an exemplary embodiment.

FIG. 4A is a schematic plan view illustrating a pixel module 1000 according to an exemplary embodiment, FIG. 4B is a schematic cross-sectional view taken along line C-C of FIG. 4A, FIG. 4C is a rear view of the pixel module 1000, and FIG. 4D is a circuit diagram of the pixel module 1000.

Referring to FIGS. 4A and 4B, the pixel module 1000 includes a circuit board 1001 and unit pixels 100 arranged on the circuit board 1001. The pixel module 1000 may further include a cover layer 1010 covering the unit pixels 100.

The circuit board 1001 may have a circuit for electrically connecting a panel substrate 2100 and light emitting devices 10a, 10b, and 10c. The circuit in the circuit board 1001 may be formed to have a multilayer structure. The circuit board 1001 may also include a passive circuit for driving the light emitting devices 10a, 10b, and 10c in a passive matrix driving manner or an active circuit for driving the light emitting devices 10a, 10b, and 10c in an active matrix driving manner. The circuit board 1001 may include pads 1003 exposed on a surface thereof. The pads 1005 may be arranged corresponding to bumps in the unit pixels 100 to be mounted thereon.

As a detailed configuration of the unit pixels 100 is the same as that described with reference to FIGS. 3A and 3B, detailed descriptions thereof will be omitted to avoid redundancy. The unit pixels 100 may be arranged on the circuit board 1001. The unit pixels 100 may be arranged in a 2×2 matrix as shown in FIG. 4A, but the inventive concepts are not limited thereto, and, in some exemplary embodiments, the unit pixels 100 may be arranged in various matrices such as 2×3, 3×3, 4×4, 5×5, or the like.

The unit pixels 100 are bonded to the circuit board 1001 by a bonding material 1005. For example, the bonding material 1005 may bond the bumps 133a, 133b, 133c, and 133d to the pads 1003. The bonding material 1005 may be formed of, for example, solder. When the bumps 133a, 133b, 133c, and 133d are formed of solder, the bonding material 1005 may be omitted.

The cover layer 1010 covers a plurality of unit pixels 100. The cover layer 1010 may improve contrast of the displaying apparatus by preventing optical interference between the unit pixels 100.

The cover layer 1010 may be formed of, for example, a dry-film type solder resist (DFSR), a photoimageable solder resist (PSR), a black material (BM), an epoxy molding compound (EMC), or the like. The cover layer 1010 may be formed using, for example, a technique such as lamination, spin coating, slit coating, printing, or the like.

A displaying apparatus 10000 may be provided by mounting the pixel modules 1000 on the panel substrate 2100 of FIG. 1 as shown in FIG. 4A and FIG. 4B. The circuit board 1001 has bottom pads connected to the pads 1003. The bottom pads may be arranged in a one-to-one correspondence with the pads 1003, but the number of the bottom pads may be reduced through a common connection. In this regard, the pixel module 1000 having the unit pixels 100 arranged in a 2×2 matrix will be described with reference to FIG. 4C and FIG. 4D as an example.

FIG. 4C illustrates a rear view of the pixel module 1000, and bottom pads C1, C2, R1, R2, G1, G2, B1, and B2 of the circuit board 1001 are illustrated. As the pixel modules 1000 are arranged in a 2×2 matrix, a total of four pixel modules are arranged on the circuit board 1001. Three light emitting devices 10a, 10b, and 10c and four bumps 133a, 133b, 133c, and 133d are disposed on each pixel module 1000. Accordingly, sixteen pads 1003 corresponding to the bumps of the four unit pixels 100 will be provided on the circuit board 1001. However, only eight bottom pads may be disposed, and the eight bottom pads may be connected to the panel substrate 2100 to individually drive each of the light emitting devices 10a, 10b, and 10c.

FIG. 4D illustrates a schematic circuit diagram in which each of the light emitting devices 10a, 10b, and 10c are connected to the bottom pads C1, C2, R1, R2, G1, G2, B1, and B2.

Referring to FIG. 4D, the bottom pad C1 is commonly connected to cathodes of the light emitting devices 10a, 10b, and 10c disposed in the left column, and the bottom pad C2 is commonly connected to cathodes of the light emitting devices 10a, 10b, and 10c disposed in the right column.

In the unit pixels 100 arranged in the upper row, the bottom pad R1 may be connected to anodes of the first light emitting devices 10a, the bottom pad G1 may be connected to anodes of the second light emitting devices 10b, and the bottom pad B1 may be connected to anodes of the third light emitting devices 10c.

In the unit pixels 100 arranged in the lower row, the bottom pad R2 may be connected to the anodes of the first light emitting devices 10a, the bottom pad G2 may be connected to the anodes of the second light emitting devices 10b, and the bottom pad B2 may be connected to the anodes of the third light emitting devices 10c.

Herein, the bottom pads R1, G1, B1, R2, G2, and B2 represent pads connected to red, green, and blue light emitting devices, respectively. However, the order of arrangement of the red, green, and blue light emitting devices may be changed, and, accordingly, locations to which the bottom pads R1, G1, B1, R2, G2, and B2 are connected may also be changed. For example, the circuit diagram of FIG. 4D shows the bottom pads such that the first light emitting devices 10a are red light emitting devices, the second light emitting devices 10b are green light emitting devices, and the third light emitting devices 10c are blue light emitting devices. Alternatively, the first light emitting devices 10a may be the blue light emitting devices, and the third light emitting devices 10c may be the red light emitting devices, and, in this case, the locations of the bottom pads R1 and R2 and the bottom pads B1 and B2 may be interchanged.

According to the illustrated exemplary embodiment, as the bottom pads C1 and C2 are commonly connected to the cathodes of the light emitting devices in each column, and each of the bottom pads R1, G1, B1, R2, B2, and G2 are connected to the anodes of the two light emitting devices, each of the light emitting devices 10a, 10b, and 10c may be driven independently while reducing the total number of the bottom pads.

Figure 4E:
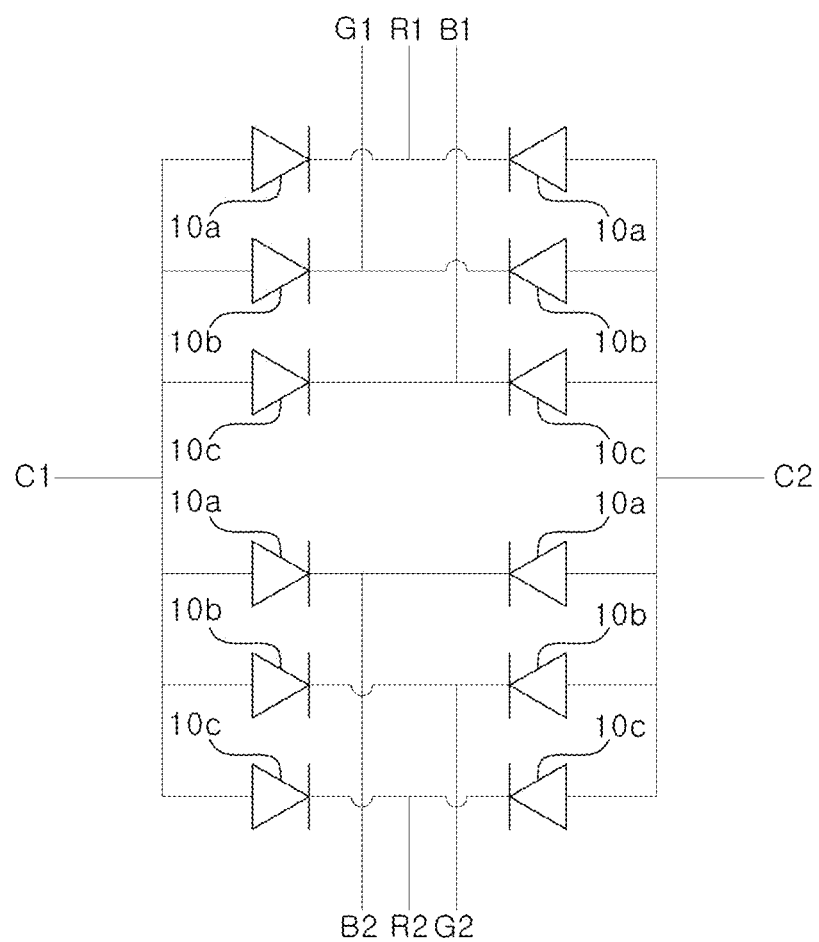
FIG. 4E is a schematic circuit diagram illustrating a pixel module according to an exemplary embodiment.

Although it is described and illustrated that the bottom pads C1 and C2 are connected to the cathodes of the light emitting devices and the bottom pads R1, G1, B1, R2, B2 and G2 are connected to the anodes of the light emitting device, the bottom pads C1 and C2 may be connected to the anodes of the light emitting devices, and the bottom pads R1, G1, B1, R2, B2 and G2 may be connected to the cathodes of the light emitting device as shown in FIG. 4E.

Herein, although the pixel module 1000 is described that the unit pixels 100 are arranged in a 2×2 matrix, the number of the bottom pads may be reduced using a common connection circuit even when the unit pixels 100 are arranged in another matrix such as 3×3, 5×5, or the like.

The light emitting devices 10a, 10b, and 10c in the pixel module 1000 may be individually driven by a driving IC disposed on the panel substrate 2100, and images may be implemented by a plurality of pixel modules 1000.

In the illustrated exemplary embodiment, the displaying apparatus is provided as the unit pixels 100 are formed into the pixel module 1000, and the pixel modules 1000 are mounted on the panel substrate 2100, and thus, a process yield of the displaying apparatus may be improved. However, the inventive concepts are not limited thereto, and the unit pixels 100 may be directly mounted on the panel substrate 2100.

Referring to FIG. 3B, a protection layer 131 may be formed using a photosensitive PSR so as to define regions where the bumps 133a, 133b, 133c, and 133d are formed in the unit pixel 100. The protection layer 131 generally has a thickness corresponding to a height of each of the bumps 133a, 133b, 133c, and 133d.

Figure 5A:
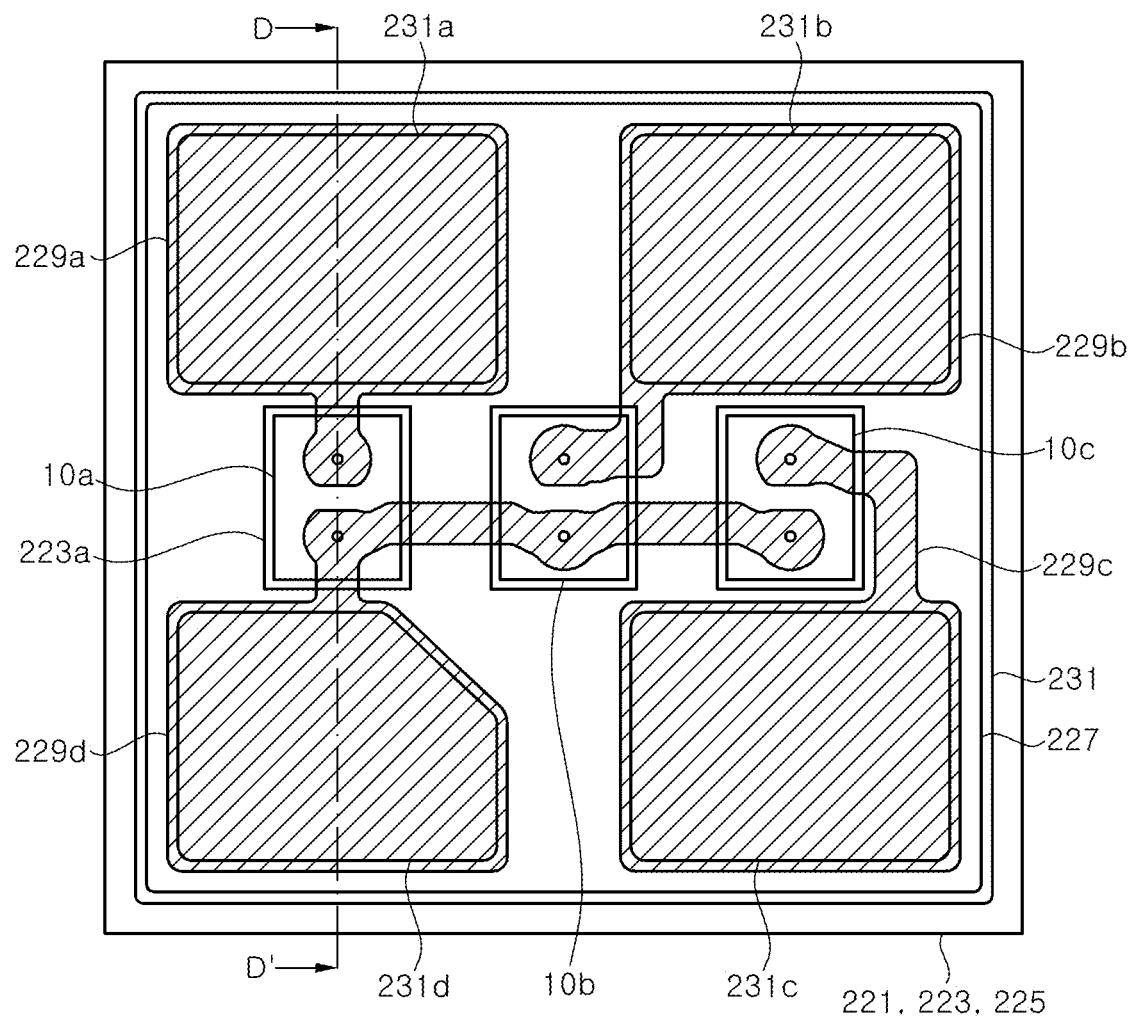
FIG. 5A is a schematic plan view illustrating a unit pixel according to a second exemplary embodiment.
Figure 5B:
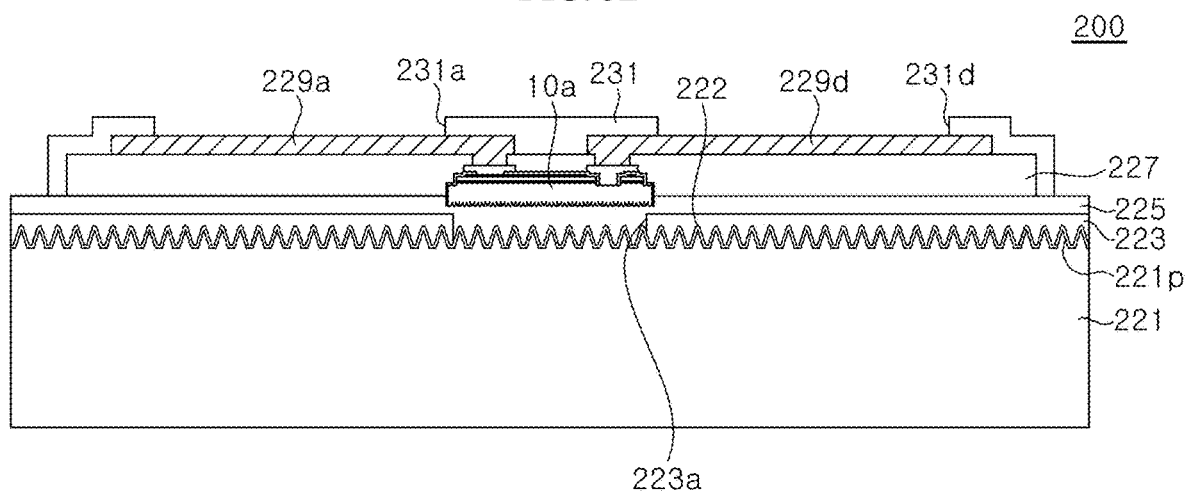
FIG. 5B is a schematic cross-sectional view taken along line D-D of FIG. 6A.

FIG. 5A is a schematic plan view illustrating a unit pixel 200 according to a second exemplary embodiment, and FIG. 5B is a schematic cross-sectional view taken along line D-D of FIG. 5A.

Referring to FIGS. 5A and 5B, the unit pixel 200 according to the exemplary embodiment may include a transparent substrate 221, a first, a second, and a third light emitting devices 10a, 10b, and 10c, a surface layer 222, a light blocking layer 223, an adhesive layer 225, a step adjustment layer 227, connection layers 229a, 229b, 229c, and 229d, and an insulation material layer 231. In addition, the transparent substrate 221 may have a concave-convex pattern 221p.

Since the transparent substrate 221, the first, second, and third light emitting devices 10a, 10b, and 10c, the surface layer 222, the light blocking layer 223, the adhesive layer 225, and the step adjustment layer 227 are the same as those described for the unit pixel 100 of the first exemplary embodiment, detailed descriptions thereof will be omitted to avoid redundancy.

Meanwhile, the connection layers 229a, 229b, 229c, and 229d are substantially similar to the connection layers 129a, 129b, 129c, and 129d described above, other than locations and shapes thereof, and detailed descriptions are omitted.

The insulation material layer 231 is formed to have a relatively thin thickness compared to that of the protection layer 131 of the first exemplary embodiment. For example, the insulation material layer 231 may be formed to have a thickness thinner than that of the step adjustment layer 227. A sum of the thicknesses of the insulation material layer 231 and the step adjustment layer 227 may be about 1 μm or more and 50 μm or less, but the inventive concepts are not limited thereto.

The insulation material layer 231 covers side surfaces of the step adjustment layer 227 and the connection layers 229a, 229b, 229c, and 229d. In addition, the insulation material layer 231 may cover a portion of the adhesive layer 225. The insulation material layer 231 has openings 231a, 231b, 231c, and 231d exposing the connection layers 229a, 229b, 229c, and 229d, and accordingly, pad regions of the unit pixel 200 may be defined.

In an exemplary embodiment, the insulation material layer 231 may be a translucent material, and may be formed of an organic or inorganic material. The insulation material layer 231 may be formed of, for example, polyimide. When the insulation material layer 231 along with the step adjustment layer 227 is formed of polyimide, all of lower, side, and upper surfaces of the connection layers 229a, 229b, 229c, and 229d may be surrounded by polyimide, except for the pad regions.

According to the illustrated exemplary embodiment, although the unit pixel 200 is substantially similar to the unit pixel 100 described with reference to FIGS. 3A and 3B, the unit pixel 200 does not include the bumps 133a, 133b, 133c, and 133d, but it includes a relatively thin insulation material layer 231 instead of the PSR protection layer 131. As such, it is possible to prevent an occurrence of a defect in the unit pixel 200 while the unit pixel 200 is transferred.

Meanwhile, the unit pixel 200 may be mounted on a circuit board using a bonding material such as solder, and the bonding material may bond the connection layers 229a, 229b, 229c, and 229d exposed to the openings 231a, 231b, 231c, 231d of the insulation material layer 231 to pads on the circuit board.

Figure 6:
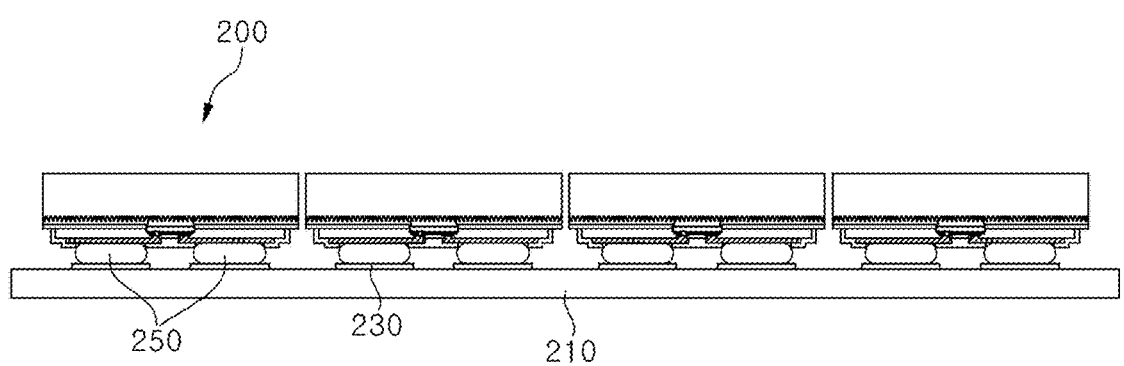
FIG. 6 is a schematic cross-sectional view illustrating a displaying apparatus in which the unit pixel is mounted according to the second exemplary embodiment.

FIG. 6 is a schematic cross-sectional view illustrating a displaying apparatus in which the unit pixel 200 is mounted according to the second exemplary embodiment.

Referring to FIG. 6, the unit pixels 200 are mounted on a circuit board 210 using a bonding material 250. The circuit board 210 may be the panel substrate 2100 described above, or may be the circuit board 1001 of the pixel module 1000.

The bonding material 250 bonds the connection layers 229a, 229b, 229c, and 229d exposed through the openings 231a, 231b, 231c, 231d of the insulation material layer 231 to pads 230 on the circuit board 210, as described with reference to FIGS. 5A and 5B. The bonding material 250 may be, for example, solder, and after a solder paste is disposed on the pads 230 using a technique such as screen printing, may bond the unit pixel 200 and the circuit board 210 through a reflow process.

According to the illustrated exemplary embodiment, unlike the unit pixel 100, since the bumps are not included, the bonding material 250 having a single structure between the connection layers 229a, 229b, 229c, and 229d and the pads 230 is disposed, and the bonding material 250 directly connects the connection layers 229a, 229b, 229c, and 229d to the pads 230, as shown in FIG. 6.

Figure 7:
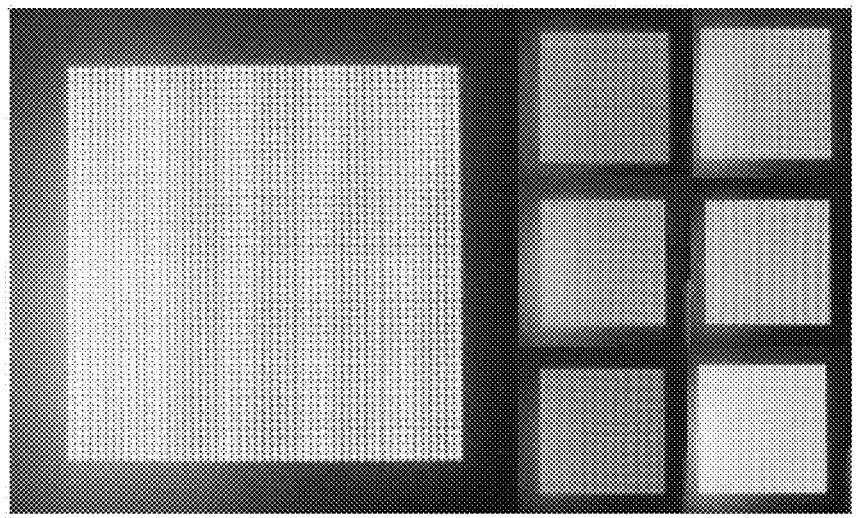
FIG. 7 are photographs showing some display screens of the displaying apparatus formed using the unit pixels according to the second exemplary embodiment.

FIG. 7 illustrates photographs showing some display screens of the displaying apparatus formed using the unit pixels 200 according to the second exemplary embodiment.

Referring to FIG. 7, a screen of various colors may be implemented by driving the light emitting devices 10a, 10b, and 10c in the unit pixels 200. A screen arranged on the left is implemented by driving all of the light emitting devices 10a, 10b, and 10c in the unit pixels 200. Meanwhile, screens implemented by driving the red light emitting device 10a, the green light emitting device 10b, and the blue light emitting device 10c in the unit pixels 200, respectively, and screens implemented by driving a combination of any two types of light emitting devices 10a, 10b, and 10c are displayed in small size on the right. The displaying apparatus according to the exemplary embodiment may implement colors of various colors by using the unit pixels 200.

Figure 8A:
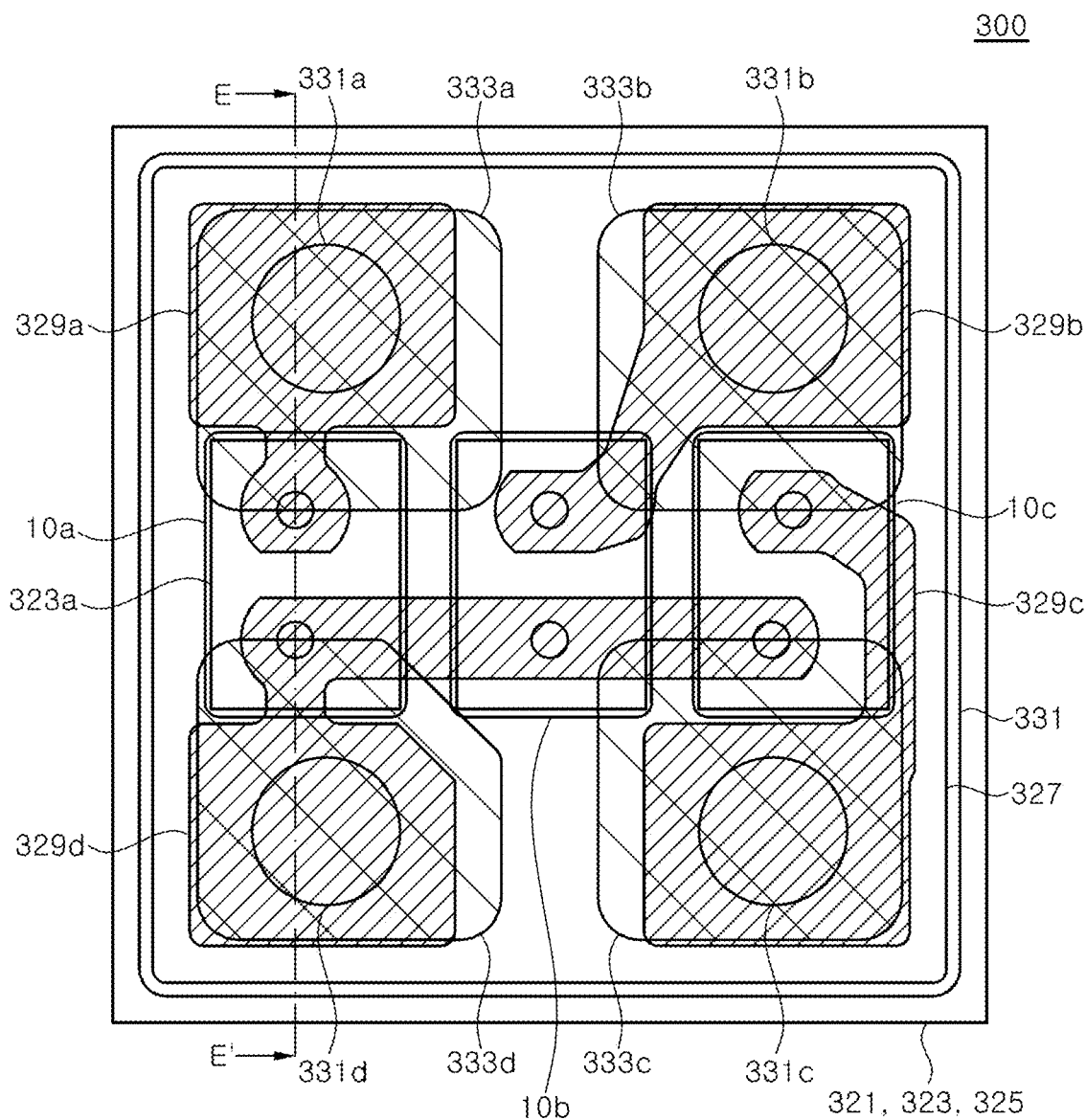
FIG. 8A is a schematic plan view illustrating a unit pixel according to a third exemplary embodiment.
Figure 8B:
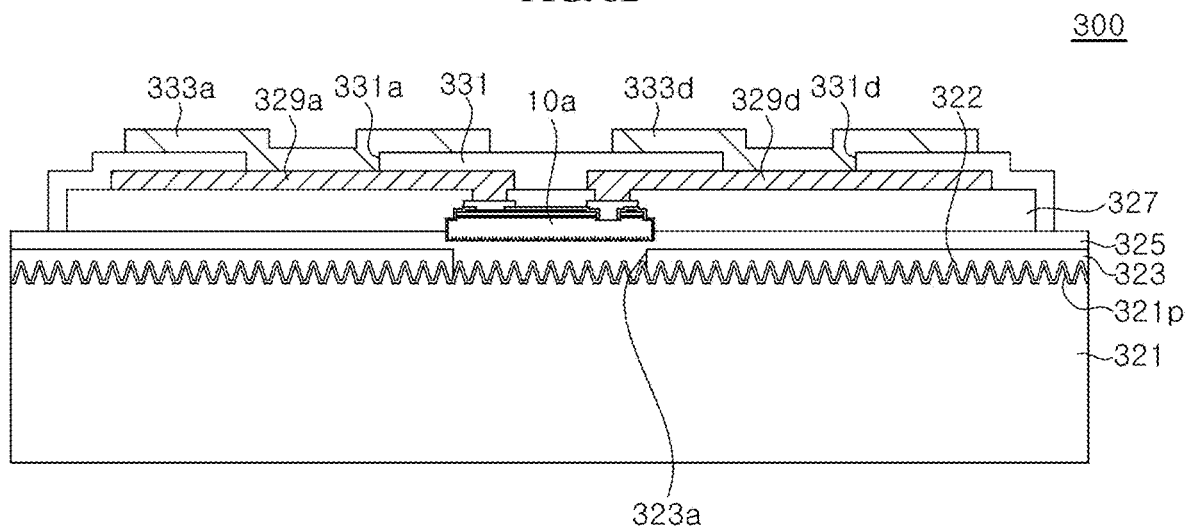
FIG. 8B is a schematic cross-sectional view taken along line E-E of FIG. 9A.

FIG. 8A is a schematic plan view illustrating a unit pixel 300 according to a third exemplary embodiment, and FIG. 8B is a schematic cross-sectional view taken along line E-E of FIG. 8A.

Referring to FIGS. 8A and 8B, the unit pixel 300 according to the exemplary embodiment may include a transparent substrate 321, a first, a second, and a third light emitting devices 10a, 10b, and 10c, a surface layer 322, a light blocking layer 323, an adhesive layer 325, a step adjustment layer 327, connection layers 329a, 329b, 329c, and 329d, an insulation material layer 331, and bonding pads 333a, 333b, 333c, and 333d. In addition, the transparent substrate 321 may have a concave-convex pattern 321p.

Since the transparent substrate 321, the first, second, and third light emitting devices 10a, 10b, and 10c, the surface layer 322, the light blocking layer 323, the adhesive layer 325, the step adjustment layer 327, the connection layers 329a, 329b, 329c, and 329d, and the insulation material layer 331 are similar to those described for the unit pixel 200 of the second exemplary embodiment, detailed descriptions thereof are omitted to avoid redundancy.

However, an external size of the transparent substrate 321 may be relatively smaller than that of the transparent substrate 221. For example, the transparent substrate 221 may have an area larger than about 300 µm×300 µm, but the transparent substrate 321 may be smaller area than that of the transparent substrate 221. For example, the transparent substrate 321 may have an area of about 200 µm×200 µm or less.

In a case of the unit pixel 200, when the size of the transparent substrate 221 is small, exposed areas of the connection layers 229a, 229b, 229c, and 229d exposed through the openings 231a, 231b, 231c, and 231d of the insulation material layer 231 become relatively small. As such, when the unit pixel 200 is mounted on the circuit board 210, the areas of the connection layers 229a, 229b, 229c, and 229d contacting the bonding material 250 may be reduced.

The unit pixel 300 according to the exemplary embodiment forms the bonding pads 333a, 333b, 333c, and 333d on the insulation material layer 331. The insulation material layer 331 has openings 331a, 331b, 331c, and 331d exposing the connection layers 329a, 329b, 329c, and 329d, and the bonding pads 333a, 333b, 333c, and 333d are electrically connected to the connection layers 329a, 329b, 329c, and 329d through the openings 331a, 331b, 331c, and 331d of the insulation material layer 331, respectively.

Meanwhile, the bonding pads 333a, 333b, 333c, and 333d may have a larger area than that of the connection layers 329a, 329b, 329c, and 329d, and in particular, the bonding pads 333a, 333b, 333c, and 333d may partially cover at least one of the light emitting devices 10a, 10b, and 10c, respectively. That is, the bonding pads 333a, 333b, 333c, and 333d may be partially overlapped with at least one of the light emitting devices 10a, 10b, and 10c in a vertical direction, respectively. Furthermore, the bonding pads 333a, 333b, 333c, and 333d may be partially overlapped with two adjacent light emitting devices, respectively. For example, in FIG. 8A, the first bonding pad 333a partially covers the red light emitting device 10a and the green light emitting device 10b, the second bonding pad 333b partially covers the green light emitting device 10b and the blue light emitting device 10b, and the third bonding pad 333c partially covers the green light emitting device 10b and the blue light emitting device 10c. Although the fourth bonding pad 333d is illustrated as partially covering only the red light emitting device 10a, it may also partially cover the green light emitting device 10b.

The first, second, third, and fourth bonding pads 333a, 333b, 333c, and 333d may be spaced apart from the light emitting devices 10a, 10b, and 10c by the step adjustment layer 327 and the insulation material layer 331, and may be electrically connected to the light emitting devices 10a, 10b, and 10c only through the connection layers 329a, 329b, 329c, and 329d. As such, an electrical short between the first, second, third, and fourth bonding pads 333a, 333b, 333c, and 333d and the light emitting devices 10a, 10b, and 10c is prevented.

According to the illustrated exemplary embodiment, even if the size of the transparent substrate 321 is relatively small, the bonding pads 333a, 333b, 333c, and 333d may be formed relatively large, and thus, the unit pixels 300 may be stably mounted on a circuit board using a bonding material such as solder.

FIGS. 9A through 9F are schematic cross-sectional views illustrating a method of manufacturing the unit pixel 300 according to the third exemplary embodiment.

Figure 9A:
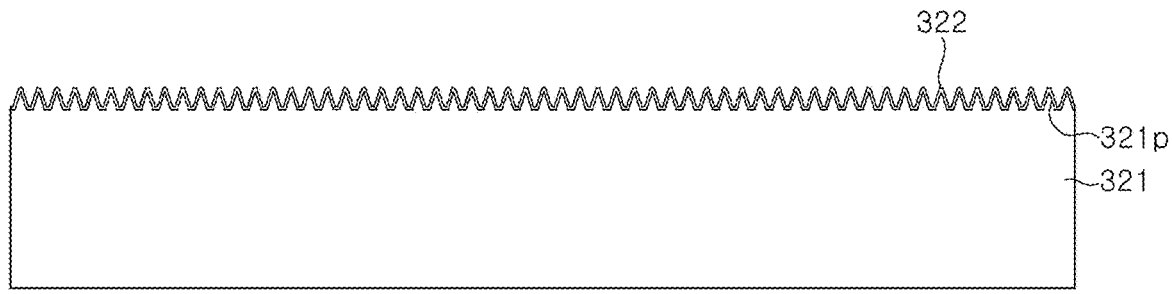
FIGS. 9A through 9F are schematic cross-sectional views illustrating a method of manufacturing the unit pixel according to the third exemplary embodiment, where.

First, referring to FIG. 9A, a concave-convex pattern 321p is formed on a surface of a transparent substrate 321. The transparent substrate 321 is a light transmissive substrate such as PET, glass substrate, quartz, sapphire substrate, or the like. In an exemplary embodiment, the concave-convex pattern 321p may be formed by etching the surface of the transparent substrate 321 using a dry or wet etching technique.

A surface layer 322 may be formed on the transparent substrate 321. In some forms, the surface layer 322 may be formed along the concave-convex pattern 321p. The surface layer 322 may be formed of, for example, a silicon oxide layer. In other forms, the surface layer 322 is formed to modify the surface of the transparent substrate 321 and may be omitted.

Figure 9B:
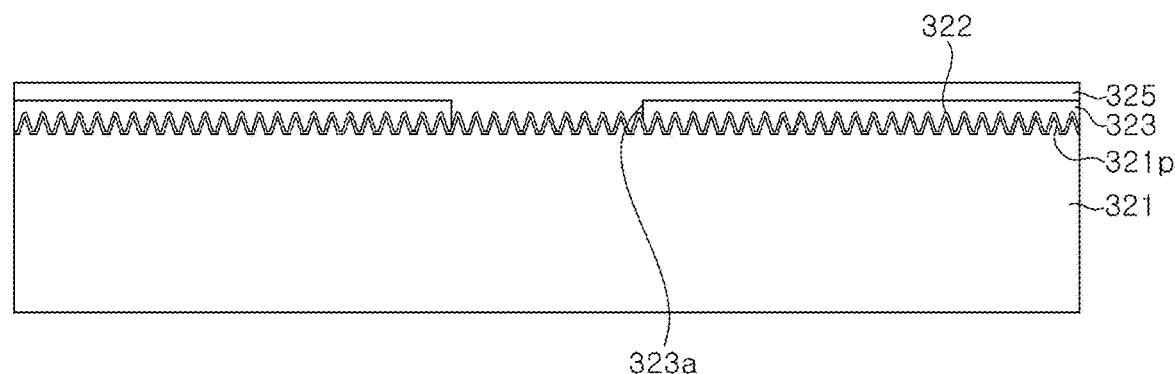

Referring to FIG. 9B, a light blocking layer 323 is formed on the surface layer 322. The light blocking layer 323 may be formed of a light-absorbing material layer, for example, a black matrix including a light-absorbing material such as carbon black. The light blocking layer 323 may also be formed of a photosensitive material layer and patterned by exposure and development. A plurality of window 323a may be formed by patterning the light blocking layer 323. The plurality of windows 323a may be formed corresponding to the light emitting devices 10a, 10b, and 10c, and these windows 323a may be spaced apart from one another.

Subsequently, an adhesive layer 325 may be formed on the light blocking layer 323. The adhesive layer 325 may cover the light blocking layer 323 and may also cover the surface layer 322 or the transparent substrate 321 exposed through the windows 323a formed on the light blocking layer 323.

The adhesive layer 325 may be formed on an entire surface of the transparent substrate 321, but the inventive concepts are not limited thereto, and may be formed in a partial region to expose a region near an edge of the transparent substrate 321. The adhesive layer 325 is used to attach the light emitting devices 10a, 10b, and 10c to the transparent substrate 321. The adhesive layer 325 may be formed of a light transmissive layer, and transmits light emitted from the light emitting devices 10a, 10b, and 10c. The adhesive layer 325 may be formed using an adhesive sheet or an organic adhesive. For example, the adhesive layer 325 may be formed using a transparent epoxy. In an exemplary embodiment, the adhesive layer 125 may include a diffuser such as $SiO_2$, $TiO_2$, ZnO, or the like to diffuse light. The light diffusing material prevents the light emitting devices 10a, 10b, and 10c from being observed from a light exiting surface.

Figure 9C:
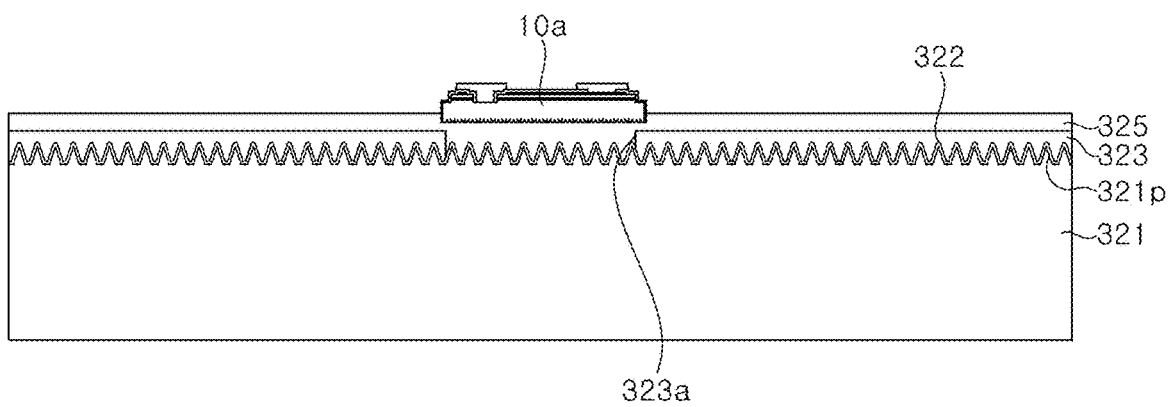

Referring to FIGS. 8A and 9C, the light emitting device 10a is disposed on the adhesive layer 325. The light emitting device 10a may be disposed corresponding to the window 323a. The light emitting device 10a may have a size smaller than that of the window 323a and may be located in an upper region of the window 323a, but the inventive concepts are not limited thereto. The light emitting device 10a may have a larger area than that of the window 323a.

Although only the light emitting device 10a is exemplarily illustrated in FIG. 9C, the light emitting devices 10b and 10c may also be disposed over the corresponding windows 323a. In an exemplary embodiment, the light emitting devices 10a, 10b, and 10c may be transferred together to the adhesive layer 325 using a transfer process.

Figure 9D:
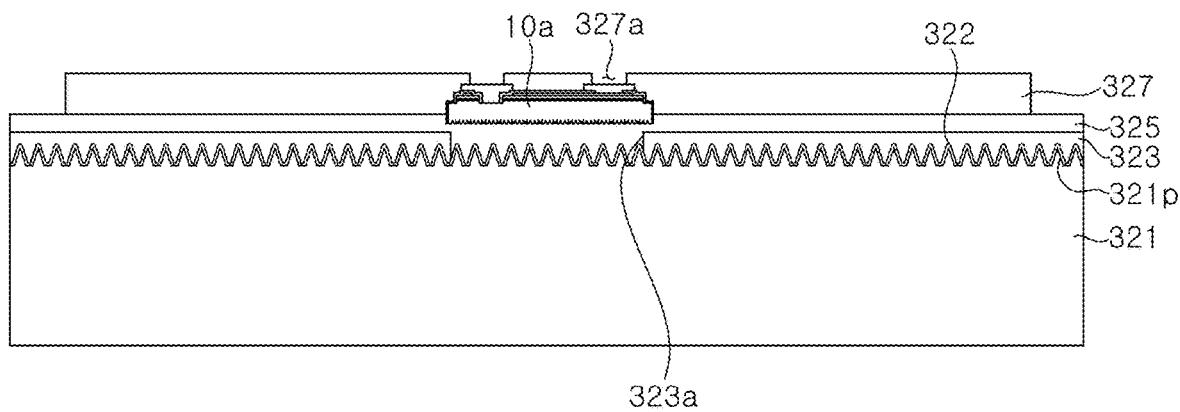

Referring to FIGS. 8A and 9D, a step adjustment layer 327 is formed to cover the light emitting devices 10a, 10b, and 10c. The step adjustment layer 327 may be formed of, for example, photosensitive polyimide, and may be patterned using exposure and development techniques.

For example, the step adjustment layer 327 may have openings 327a exposing the light emitting devices 10a, 10b, and 10c. For example, the openings 327a of the step adjustment layer 327 may expose first and second electrode pads 31 and 33 of the light emitting devices 10a, 10b, and 10c. Further, the step adjustment layer 327 may be removed along the edge of the transparent substrate 321 to expose the adhesive layer 325.

Figure 9E:
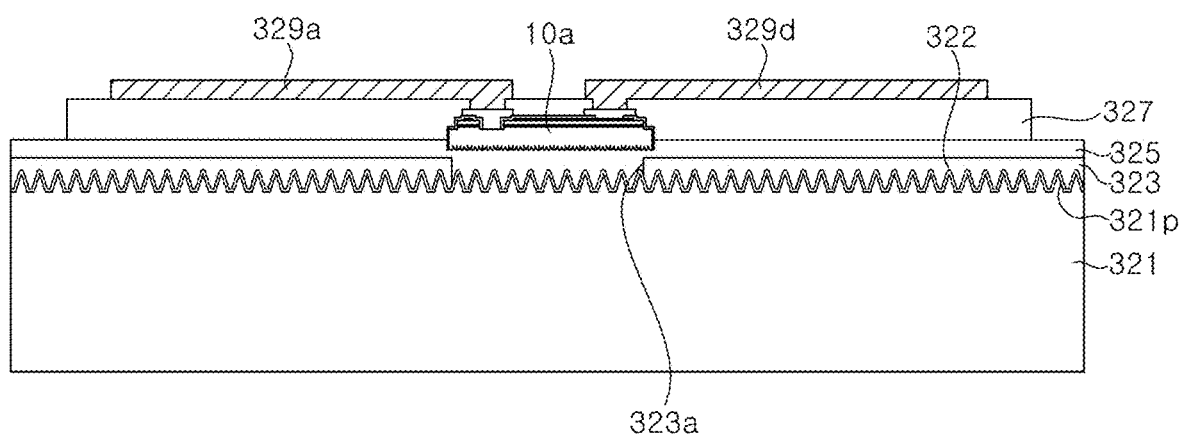

Referring to FIGS. 8A and 9E, first, second, third, and fourth connection layers 329a, 329b, 329c, and 329d are formed on the step adjustment layer 327. For example, the first, second, third, and fourth connection layers 329a, 329b, 329c, and 329d may be formed using a lift-off technique.

The first, second, third, and fourth connection layers 329a, 329b, 329c, and 329d may be electrically connected to the light emitting devices 10a, 10b, and 10c through the openings 327a of the step adjustment layer 327. For example, the first, second, and third connection layers 329a, 329b, and 329c may be electrically connected to first conductivity type semiconductor layers of the light emitting devices 10a, 10b, and 10c, respectively, and the fourth connection layer 329d may be commonly electrically connected to second conductivity type semiconductor layers of the light emitting devices 10a, 10b, and 10c.

Figure 9F:
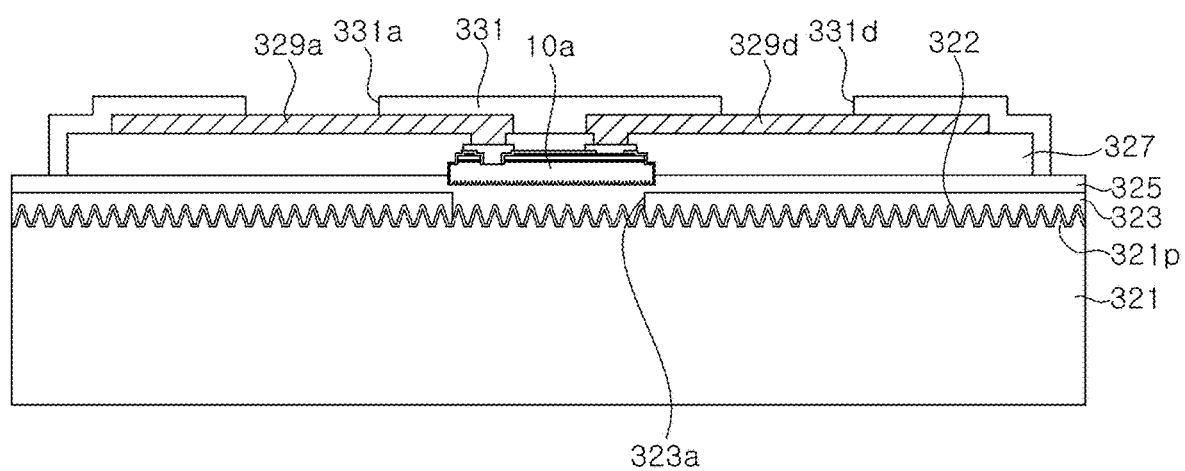

Referring to FIGS. 8A and 9F, an insulation material layer 331 covering the first, second, third, and fourth connection layers 329a, 329b, 329c, and 329d is formed. The insulation material layer 331 may also cover a side surface of the step adjustment layer 327, and may partially cover the adhesive layer 325. For example, the insulation material layer 331 may be formed of photosensitive polyimide. The insulation material layer 331 may be patterned to have openings 331a, 331b, 331c, and 331d exposing the first, second, third, and fourth connection layers 329a, 329b, 329c, and 329d, respectively.

Thereafter, bonding pads 333a, 333b, 333c, and 333d may be formed on the insulation material layer 331 to form the unit pixel 300 described with reference to FIGS. 8A and 8B.

Bonding pads 333a, 333b, 333c, and 333d may be formed to partially cover the light emitting devices 10a, 10b, and 10c outside of upper regions of the first, second, third, and fourth connection layers 329a, 329b, 329c, and 329d.

Figure 10A:
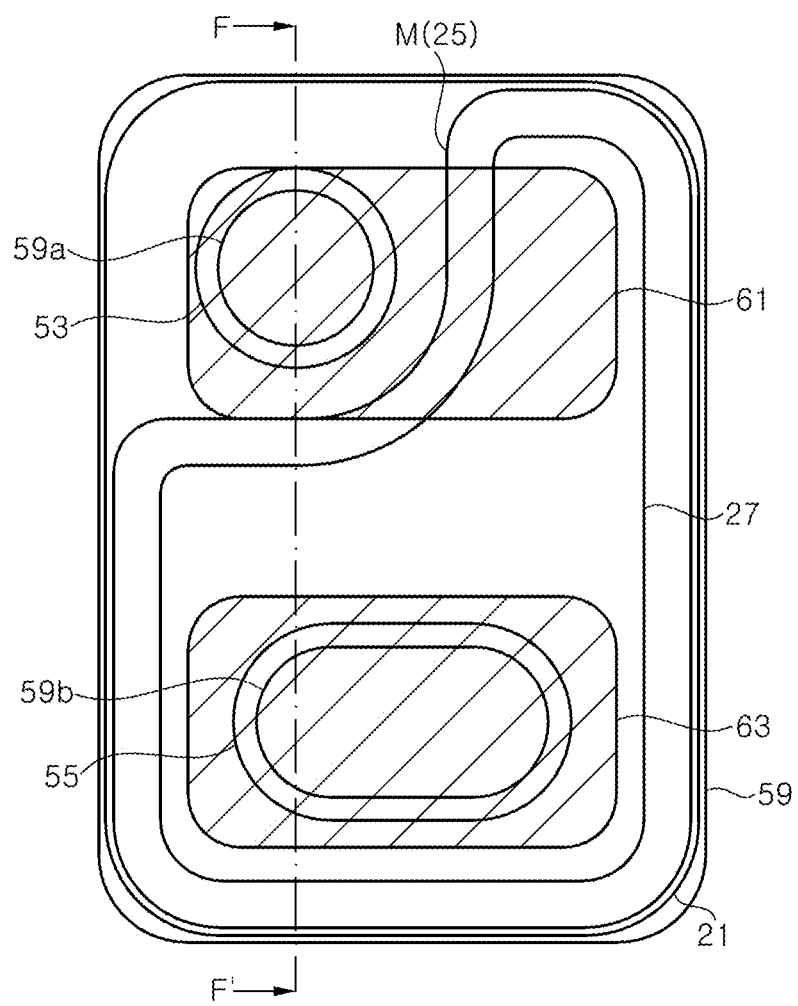
FIG. 10A is a schematic plan view illustrating a light emitting device according to an exemplary embodiment.
Figure 10B:
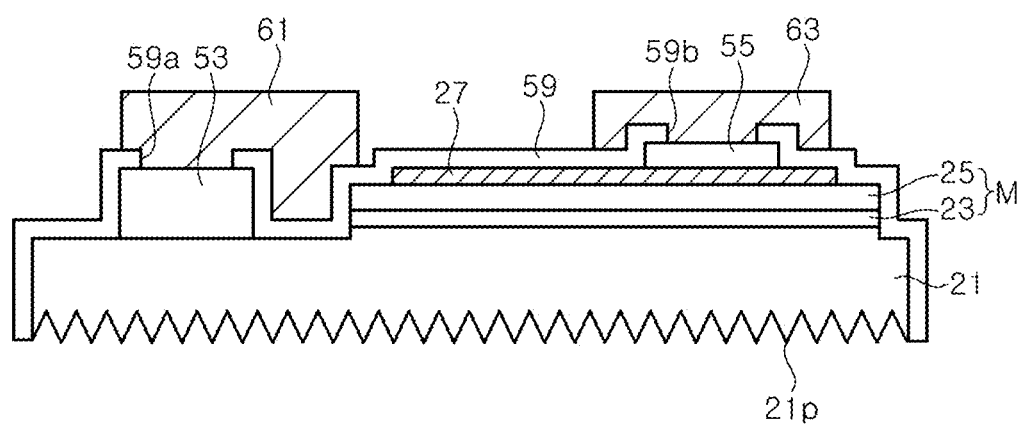
FIG. 10B is a schematic cross-sectional view taken along line F-F of FIG. 10A.

FIG. 10A is a schematic plan view illustrating a light emitting device 20a according to an exemplary embodiment, and FIG. 10B is a schematic cross-sectional view taken along line F-F of FIG. 10A. Herein, the red light emitting device 20a will be exemplarily described, but as green and blue light emitting devices 20b and 20c have substantially similar structures to that of the red light emitting device 20a, repeated descriptions thereof will be omitted.

Referring to FIGS. 10A and 10B, the light emitting device 20a according to the exemplary embodiment is substantially similar to the light emitting device 10a described with reference to FIGS. 2A and 2B, but a shape of a mesa M is different. Hereinafter, repeated contents of the light emitting device 20a and the light emitting device 10a will be briefly described, and differences between them will be described in detail.

The light emitting device 20a includes a light emitting structure including a first conductivity type semiconductor layer 21, an active layer 23, and a second conductivity type semiconductor layer 25, an ohmic contact layer 27, a first contact pad 53, a second contact pad 55, an insulation layer 59, a first electrode pad 61, and a second electrode pad 63. Since specific materials and characteristics of the light emitting structure and the ohmic contact layer 27 of the light emitting device 20a are the same as those of the light emitting device 10a, detailed descriptions thereof will be omitted.

Meanwhile, in the illustrated exemplary embodiment, the mesa M is formed so as to expose the first conductivity type semiconductor layer 21 around it. That is, in the exemplary embodiment, the first conductivity type semiconductor layer 21 is exposed from the outside of the mesa M instead of a through hole 25a.

The first contact pad 53 is disposed on the exposed first conductivity type semiconductor layer 21. The first contact pad 53 may be in ohmic contact with the first conductivity type semiconductor layer 21. For example, the first contact pad 53 may be formed of an ohmic metal layer in ohmic contact with the first conductivity type semiconductor layer 21. The ohmic metal layer of the first contact pad 53 may be appropriately selected depending on a semiconductor material of the first conductivity type semiconductor layer 21.

The second contact pad 55 may be disposed on the ohmic contact layer 27. The second contact pad 55 is electrically connected to the ohmic contact layer 27. The second contact pad 55 may be omitted.

The insulation layer 59 covers the mesa M, the ohmic contact layer 27, the first contact pad 53, and the second contact pad 55. The insulation layer 59 has openings 59a and 59b exposing the first contact pad 53 and the second contact pad 55. The insulation layer 59 may be formed as a single layer or multiple layers. Furthermore, the insulation layer 59 may include a distributed Bragg reflector in which insulation layers having different refractive indices from one another are stacked. For example, the distributed Bragg reflector may include at least two types of insulation layers selected from $SiO_2$, $Si_3N_4$, SiON, $TiO_2$, $Ta_2O_5$, and $Nb_2O_5$.

The distributed Bragg reflector reflects light emitted from the active layer 23. The distributed Bragg reflector may exhibit high reflectance over a relatively wide wavelength range including a peak wavelength of light emitted from the active layer 23, and may be designed in consideration of an incident angle of light. In an exemplary embodiment, the distributed Bragg reflector may have a higher reflectance for light incident at an incident angle of 0 degrees than thar for light incident at a different incident angle. In another exemplary embodiment, the distributed Bragg reflector may have a higher reflectance for light incident at a particular incident angle than that for light incident at the incident angle of 0 degrees. For example, the distributed Bragg reflector may have a higher reflectance for light incident at an incident angle of 10 degrees than that for light incident at the incident angle of 0 degrees.

Meanwhile, the light emitting structure of the blue light emitting device 10c has higher internal quantum efficiency compared to those of the light emitting structures of the red light emitting device 10a and the green light emitting device 10b. Accordingly, the blue light emitting device 10c may exhibit higher light extraction efficiency than those of the red and green light emitting devices 10a and 10b. As such, it may be difficult to properly maintain a color mixing ratio of red light, green light, and blue light.

To adjust the color mixing ratio of red light, green light, and blue light, the distributed Bragg reflectors applied to the light emitting devices 10a, 10b, and 10c may be formed to have different reflectance from one another. For example, the blue light emitting device 10c may have the distributed Bragg reflector having a relatively low reflectance compared to those of the red and green light emitting devices 10a and 10b. For example, the distributed Bragg reflector formed in the blue light emitting device 10c may have a reflectance of 95% or less at the incident angle of 0 degrees for blue light generated in the active layer 23, and further 90% or less, the distributed Bragg reflector formed in the green light emitting device 10b may have a reflectance of about 95% or more and 99% or less at the incident angle of 0 degrees for green light, and the distributed Bragg reflector formed in the red light emitting device 10a may have a reflectance of 99% or more at the incident angle of 0 degrees for red light.

In an exemplary embodiment, the distributed Bragg reflectors applied to the red, green, and blue light emitting devices 10a, 10b, and 10c may have a substantially similar thickness. For example, a difference in thickness between the distributed Bragg reflectors applied to these light emitting devices 10a, 10b, and 10c may be 10% or less of a thickness of a thickest distributed Bragg reflector. By reducing the thickness difference between the distributed Bragg reflectors, process conditions applied to the red, green, and blue light emitting devices 10a, 10b, and 10c, for example, a process of patterning the insulation layer 59, may be similarly set, and furthermore, it is possible to prevent the unit pixel manufacturing process from becoming complex. Moreover, the distributed Bragg reflectors applied to the red, green, and blue light emitting devices 10a, 10b, and 10c may have a substantially similar stacking number. However, the inventive concepts are not limited thereto.

The first electrode pad 61 and the second electrode pad 63 are disposed on the insulation layer 59. The first electrode pad 61 may extend from an upper region of the first contact pad 53 to an upper region of the mesa M, and the second electrode pad 63 may be disposed in the upper region of the mesa M. The first electrode pad 61 may be connected to the first contact pad 53 through the opening 59a, and the second electrode pad 63 may be electrically connected to the second contact pad 55. The first electrode pad 61 may be directly in ohmic contact with the first conductivity type semiconductor layer 21, and in this case, the first contact pad 53 may be omitted. In addition, when the second contact pad 55 is omitted, the second electrode pad 63 may be directly connected to the ohmic contact layer 27.

Figure 11:
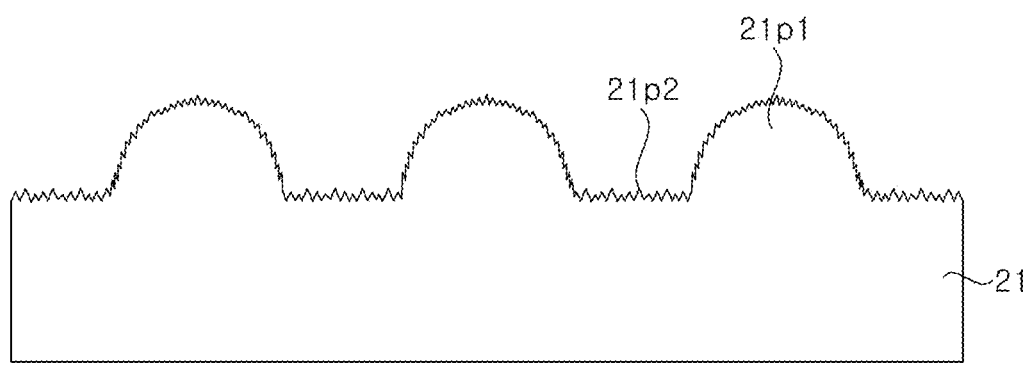
FIG. 11 is a schematic cross-sectional view illustrating a surface concave-convex pattern of a light emitting device according to an exemplary embodiment.

Meanwhile, the first conductivity type semiconductor layer 21 may include a concave-convex pattern 21p on a light exiting surface. In an exemplary embodiment, the concave-convex pattern 21p may include a first concave-convex pattern 21p1 and a second concave-convex pattern 21p2 additionally formed on the first concave-convex pattern 21p1, as illustrated in FIG. 11.

Figure 12:
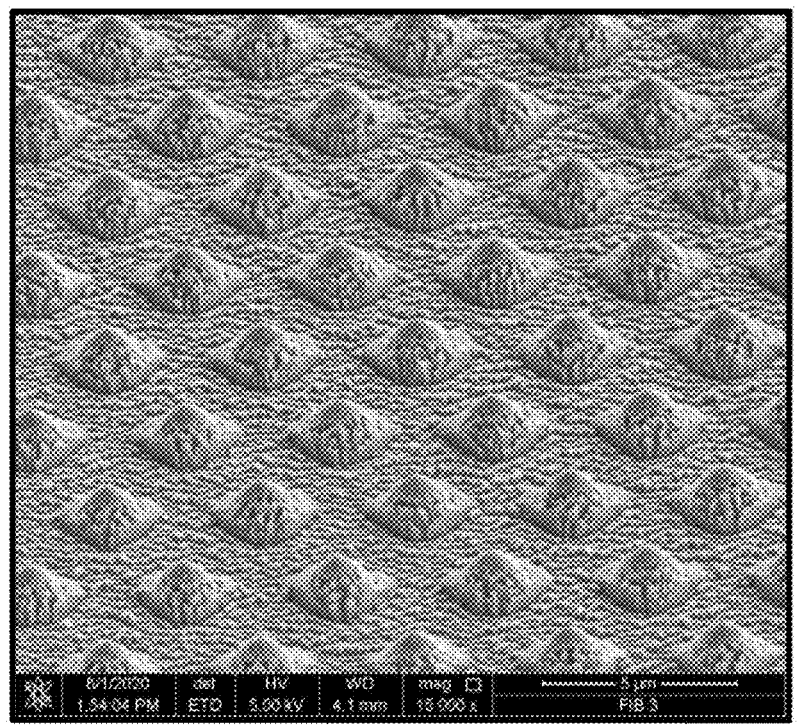
FIG. 12 is a SEM photograph showing the surface concave-convex pattern of the light emitting device.
Figure 13A:
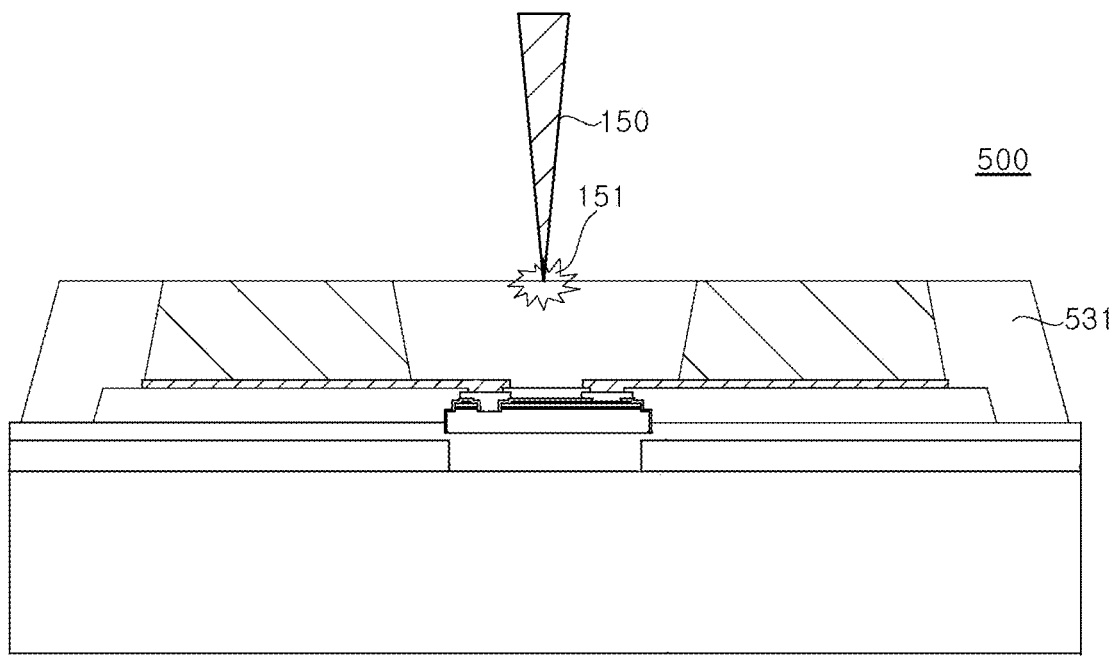
FIG. 13A is a schematic diagram illustrating a irregularity that occurs when light emitting devices are mounted.
Figure 13B:
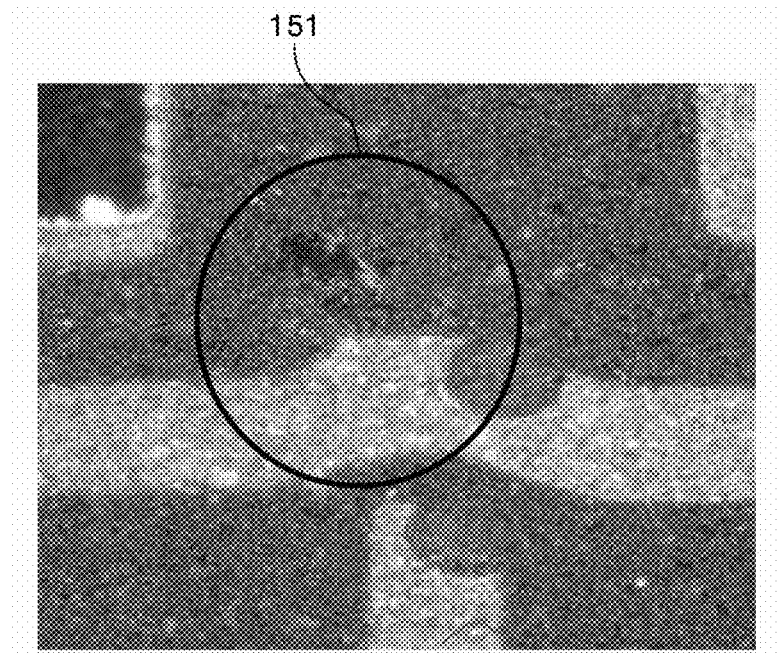
FIG. 13B is an image showing the irregularity illustrated in FIG. 13A.

Protrusions of the first concave-convex pattern 21p1 may have a height of about 2 μm to 3 μm, an interval of 1.5 μm to 2 μm, and a bottom diameter of about 3 μm to 5 μm. Meanwhile, the second concave-convex pattern 21p2 may be formed in both the protrusions of the first concave-convex pattern 21p1 and a region between the protrusions. A SEM photograph of the concave-convex pattern actually formed on a surface of the first conductivity type semiconductor layer 21 is illustrated in FIG. 12.

Although some exemplary embodiments have been described herein, it should be understood that these exemplary embodiments are provided for illustration only and are not to be construed in any way as limiting the present disclosure. It should be understood that features or components of one exemplary embodiment can also be applied to other exemplary embodiments without departing from the spirit and scope of the present disclosure.

What is claimed is:

1. A unit pixel, comprising:
a transparent substrate;
a plurality of light emitting devices arranged on the transparent substrate;
a plurality of connection layers electrically connected to the plurality of light emitting devices such that each light emitting device is electrically connected to each corresponding connection layer and a common connection layer of the plurality of connection layers; and
a plurality of bonding pads disposed over the plurality of connection layers, and electrically connected to the plurality of connection layers;
a light blocking layer disposed on the transparent substrate;
an adhesive layer disposed on the transparent substrate and configured to cover a region of the light blocking layer; and
a surface layer disposed between the transparent substrate and the light blocking layer,
wherein:
the light blocking layer has windows through which light generated from the plurality of light emitting devices passes, and
the plurality of light emitting devices are disposed to correspond to the windows.

2. The unit pixel of claim 1,
wherein the plurality of bonding pads further comprises a first bonding pad that is partially overlapped with two of the plurality of light emitting devices.

3. The unit pixel of claim 1,
wherein the transparent substrate has a concave-convex pattern on a surface facing the plurality of light emitting devices.

4. The unit pixel of claim 1,
wherein each of the plurality of light emitting devices has a first concave-convex pattern on a surface facing the transparent substrate and a second concave-convex pattern formed on the first concave-convex pattern.

5. The unit pixel of claim 1, wherein:
the plurality of light emitting devices includes at least three light emitting devices emitting light of different colors, and
the at least three light emitting devices are arranged in a line.

6. A unit pixel, comprising:
a transparent substrate;
a plurality of light emitting devices arranged on the transparent substrate;
a plurality of connection layers electrically connected to the plurality of light emitting devices such that each light emitting device is electrically connected to each corresponding connection layer and a common connection layer of the plurality of connection layers; and
a plurality of bonding pads disposed over the plurality of connection layers, and electrically connected to the plurality of connection layers;
a light blocking layer disposed on the transparent substrate;
a surface layer disposed between the light blocking layer and the transparent substrate; and
a patterned surface region disposed on the surface layer,
wherein:
the light blocking layer has windows through which light generated from the plurality of light emitting devices passes, and the patterned surface region is disposed to correspond to the windows.

7. The unit pixel of claim 6, further comprising:
a step adjustment layer covering the plurality of light emitting devices,
wherein:
the step adjustment layer has openings exposing the plurality of light emitting devices, and
the plurality of connection layers is disposed on the step adjustment layer and electrically connected to the plurality of light emitting devices through the openings of the step adjustment layer.

8. The unit pixel of claim 7, further comprising:
an insulation material layer covering the plurality of connection layers,
wherein:
the insulation material layer has openings exposing the plurality of connection layers, and
the plurality of bonding pads is electrically connected to the plurality of connection layers through the openings of the insulation material layer.

9. The unit pixel of claim 8,
wherein the insulation material layer covers side surfaces of the step adjustment layer along with side surfaces of the plurality of connection layers.

10. The unit pixel of claim 9,
wherein the insulation material layer has a thickness smaller than a thickness of the step adjustment layer.

11. The unit pixel of claim 9,
wherein the step adjustment layer and the insulation material layer are formed of polyimide.

12. The unit pixel of claim 7, wherein:
each of the plurality of light emitting devices includes:
  a light emitting structure including a first conductivity type semiconductor layer, a second conductivity type semiconductor layer, and an active layer interposed between the first conductivity type semiconductor layer and the second conductivity type semiconductor layer; and
  a first electrode pad and a second electrode pad disposed on the light emitting structure, wherein the openings of the step adjustment layer expose the first electrode pad and the second electrode pad.

13. The unit pixel of claim 12, wherein:
each of the plurality of light emitting devices further includes:
an insulation layer disposed between the light emitting structure and the first electrode pad and the second electrode pad,
wherein the insulation layer includes a distributed Bragg reflector.

14. The unit pixel of claim 13, wherein:
the plurality of light emitting devices includes a red light emitting device, a green light emitting device, and a blue light emitting device, and
an insulation layer of the blue light emitting device has a lower reflectance than a reflectance of an insulation layer of the red light emitting device and a reflectance of an insulation layer of a green light emitting device.

15. The unit pixel of claim 1,
wherein the transparent substrate has an area of 300 µm×300 µm or less.

16. A displaying apparatus, comprising:
a circuit board having pads;
a plurality of unit pixels disposed on the circuit board; and
bonding materials configured to bond the plurality of unit pixels to the pads,
each of the plurality of unit pixels including:
a transparent substrate;
a plurality of light emitting devices arranged on the transparent substrate;
a plurality of connection layers electrically connected to the plurality of light emitting devices such that each light emitting device is electrically connected to each corresponding connection layer and a common connection layer of the plurality of connection layers;
a plurality of bonding pads disposed over the plurality of connection layers, and electrically connected to the plurality of connection layers;
a light blocking layer disposed on the transparent substrate;
a surface layer disposed between the transparent substrate and the light blocking layer; and
a patterned surface region disposed on the surface layer,
wherein the light blocking layer has windows through which light generated from the plurality of light emitting devices passes, and
wherein the patterned surface region is disposed to correspond to the windows.

17. The displaying apparatus of claim 16,
wherein the bonding materials include solder.

18. The displaying apparatus of claim 16, wherein:
the plurality of light emitting devices is disposed to correspond to the windows.

19. The displaying apparatus of claim 16,
wherein the transparent substrate has an area of 300 µm×300 µm or less.

* * * * *